(12) United States Patent  (10) Patent No.: US 7,797,071 B2
Silverbrook  (45) Date of Patent: *Sep. 14, 2010

(54) PRINTER SYSTEM INCLUDING A PLACEMENT MECHANISM FOR PLACING OBJECTS

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 20 days.

This patent is subject to a terminal disclaimer.

(21) Appl. No.: 11/749,159

(22) Filed: May 16, 2007

(65) Prior Publication Data

US 2007/0208448 A1    Sep. 6, 2007

Related U.S. Application Data

(63) Continuation of application No. 10/753,486, filed on Jan. 9, 2004, now Pat. No. 7,231,275.

(30) Foreign Application Priority Data

Jan. 16, 2003    (AU)    ............................... 2003900180

(51) Int. Cl.
    *G06F 19/00* (2006.01)
(52) U.S. Cl. ........................ 700/119; 264/308; 425/375; 425/447; 347/1
(58) Field of Classification Search ................ 395/119; 358/1.1; 347/1
    See application file for complete search history.

(56) References Cited

U.S. PATENT DOCUMENTS

| 5,017,417 | A | | 5/1991 | Miyazawa et al. |
| 5,594,652 | A | * | 1/1997 | Penn et al. ................... 700/119 |
| 5,841,452 | A | | 11/1998 | Silverbrook |
| 6,019,457 | A | | 2/2000 | Silverbrook |
| 6,165,406 | A | * | 12/2000 | Jang et al. .................... 264/308 |
| 6,217,148 | B1 | | 4/2001 | Adler et al. |
| 2002/0067382 | A1 | | 6/2002 | Vega et al. |
| 2004/0094058 | A1 | | 5/2004 | Kasperchik et al. |

FOREIGN PATENT DOCUMENTS

| DE | 10014682 A1 | 9/2001 |
| GB | 2360978 A | 10/2001 |
| JP | 54036386 | 3/1979 |
| JP | 02-139216 A | 5/1991 |

* cited by examiner

*Primary Examiner*—Stephen D Meier
*Assistant Examiner*—Alexander C Witkowski

(57) ABSTRACT

A printer system is provided for developing a three dimensional (3D) printed structure. The system includes a plurality of spaced apart sets of printing devices. A conveyor system is arranged to serially convey a print medium in register with each set so that printed voxels from each successive set can form successive layers of the 3D printed structure upon the print medium. A placement mechanism is configured to place an object upon layers of the 3D printed structure.

12 Claims, 18 Drawing Sheets

PRINTER SYSTEM INCLUDING A PLACEMENT MECHANISM FOR PLACING OBJECTS

CROSS REFERENCE TO RELATED APPLICATIONS

The present application is a Continuation of U.S. application Ser. No. 10/753,486 filed on Jan. 9, 2004, now issued U.S. Pat. No. 7,231,275, all of which are herein incorporated by reference.

FIELD OF INVENTION

This invention relates to the creation of objects using digital additive manufacturing and more particularly to creating working objects that may be electrically and/or mechanically active.

CO-PENDING APPLICATIONS

Various methods, systems and apparatus relating to the present invention are disclosed in the following co-pending applications filed by the applicant or assignee of the present invention simultaneously with the present application:

| | | | | | |
|---|---|---|---|---|---|
| 7206654 | 7162324 | 7162325 | 7146236 | 10/753475 | 10/753499 |
| 6997698 | 10/753332 | 10/753643 | 10/753440 | 10/753420 | 7195475 |

The disclosures of these co-pending applications are incorporated herein by cross-reference.

BACKGROUND

Digital additive manufacturing is a process by which an object is defined three dimensionally by a series of volume elements (hereinafter referred to as voxels). The object is then produced by creating/laying down each voxel one at a time, in rows at a time, swaths at a time or layers at a time.

There exists systems that use modified inkjet type technology to 'print' material onto a substrate, so building the object. However, these systems typically utilize a single scanning printhead and are only useful for producing non-working models.

SUMMARY OF INVENTION

In the present invention we digitally define objects as a series of voxels and have a production line that creates objects by creating each voxel. The production line simultaneously creates different portions of objects with each portion produced by a separate subsystem. In the preferred embodiments each portion is for different products and so the system builds up multiple objects simultaneously. The finished objects may be of identical or of different designs. The portions may be of any shape that may be digitally described. Portions produced by different subsystems may have different shapes.

In the preferred embodiments each and every voxel has the same dimension. However, a product may be defined by voxels of more than one size.

The portions are preferably created or laid down onto one or more substrates. In the preferred embodiments one or more substrates are provided, each having a substantially planar surface upon which material is deposited. Each of the surfaces preferably moves in it's own plane past the subsystems but does not otherwise move relative to the subsystems. Each substrate need not have a planar surface upon which material is deposited and the surface may be of any shape desired. The substrate may move past the subsystems at a constant velocity along a path or may move in steps. The substrate may also be caused to rotate about one or more axes, as it moves between subsystems, as it moves past subsystems, as it is stationary or in combinations of these. In the preferred embodiments a continuous substrate moves past the subsystems of the production line at a substantially constant velocity.

The portions of the object produced by successive subsystems preferably lie on top of each other but could be spaced apart from each other, positioned end on end, adjacent to each other or in any other configuration. As an example, a substrate having a cylindrical surface may be caused to rotate about its axis as it moves past a subsystem, so that material deposited extends in a helix on the cylindrical surface.

The portions are preferably layers of the object and the layers are preferably two dimensional, i.e. they lie in a flat plane. However, the layers need not be planar. The layers may have a constant thickness. Layers having differing thickness within the one layer are within the scope of the invention. Similarly objects may be made with multiple layers that do not have the same thickness characteristics.

In the preferred embodiments each layer is planar, is made up of voxels of constant size and all layers have the same dimensions. Alternate layers may be offset relative to each other. Preferably alternate layers are offset by half a voxel in one or both of two mutually orthogonal directions.

Because voids may be formed in the object, when we refer to a 'layer' we mean a layer as defined, which may include voids, not a continuous layer of material or materials.

In preferred embodiments each layer is created by one or more printheads. In the preferred embodiments the printheads are arranged along a longitudinally extending production line and one or more substrates move past the printheads, and apart from the first layer, the printheads print onto a previously printed layer of material(s). The printheads for all layers operate simultaneously and so whilst the first printhead is printing a first layer of a first set of one or more products, the second printhead is printing a second layer of a second set of one or more products and the third printhead is printing a third layer of a third set. Thus if we have a product 1000 layers high we have 1000 different subsystems, one for each layer. These 1000 subsystems operate to simultaneously produce 1000 different layers of 1000 sets of products.

In the preferred embodiments the printheads extend across the width of the substrate and are capable of printing across the full substrate width simultaneously i.e. they do not scan or raster when printing but are stationary. This enables a substrate to be moved past the printheads at a substantially constant speed, with the printheads printing rows of material onto the substrate. The substrate speed is matched to the row width and printhead cycle time so that the substrate has moved the width of the rows printed for each printhead cycle. Thus the next row or rows printed by each printhead will be printed next to a previously printed row or rows. In the preferred embodiments the printheads each print two rows simultaneously for increased substrate speed.

Whilst substrate width printheads are preferred, scanning type printheads may be utilized to simultaneously produce multiple layers of objects.

The terms "printhead", "print" and derivatives thereof are to be understood to include any device or technique that deposits or creates material on a surface in a controlled manner.

Each layer is printed by one or more printheads. We refer to the printhead or printheads for a layer as a 'layer group'. As used in the description and claims it is to be understood that a layer group may have only one printhead that prints one material and the use of "group" is not to be taken to require multiple printheads and/or multiple materials.

Whilst the layer groups may have multiple printheads, each layer group preferably prints only one layer at any one time, which may be made of one material or multiple materials. The number of printheads in each layer is usually determined by the number of materials to be printed. In the preferred embodiments each material is printed by a separate printhead and any additional printheads are only to enable a single layer to have multiple materials within it. This is because the materials being printed have a relatively high viscosity compared to water based inks and so require large supply channels. Thus in the description it is assumed that each printhead only prints one material. Thus if the system is capable of printing N different materials, at one printhead per material, this requires N printheads per layer. However, this is not to preclude printheads that print multiple materials.

However, because each printhead could print more than one material or multiple printheads could print the same material, there does not have to be a one to one ratio between the number of printheads and the number of different materials. It is not critical that all the layer groups are identical, and in some embodiments it is desirable that different layer groups print different numbers of materials or different combinations of materials.

It will be appreciated that for production efficiency more than one printhead in a layer group may print the same material. Where the refill rate of the printheads for different materials is substantially the same, speed increases can only be achieved when all materials have the same number of printheads. However if one material requires a much longer refill time, provision of two or more printheads for that material alone may allow increased substrate speed.

When different materials are printed, they may need to be printed at different temperatures and so in preferred embodiments the printheads of a layer group may be maintained at different temperatures.

Even if only one material is used there are advantages in printing material compared to molding. For example, it is possible to create voids in the finished product. The voids may be of any complexity that may be digitally described. Thus, any pattern of dots may be missing from the object created.

The number of separate products that may be printed simultaneously depends on the printhead width, the product size across the substrate, the product size along the substrate and the longitudinal spacing between products.

The preferred systems are capable of printing most materials that are required but there are circumstances where a discrete object may be incorporated into products. Examples of such discrete objects include semiconductor microchips, which can be manufactured in more appropriate materials and in much smaller feature sizes than in the current systems of the invention. For semiconductor devices, the device speed is dependant on feature size and materials used. Whilst preferred embodiments of the invention can produce organic semiconductors, these are relatively slow compared to conventional inorganic semiconductors. Thus, for example, where a high speed integrated circuit is required, insertion of a separately manufactured integrated circuit chip will be appropriate, as opposed to printing a low speed circuit. Mechanically active objects may also be inserted where printing cannot satisfactorily produce them. In embodiments that create three dimensional products, the printing process may create the cavities into which such discrete devices may be inserted.

The material(s) printed by the printheads may be hot melts. Typical viscosities are about 10 centipoise. The materials that may be printed include various polymers and metals or metal alloys. It is thus possible to print wires, in both two and three dimensions in products. The material solidifies to a solid, either by freezing or by other processing to form solid voxels. As used in the description and claims the terms cured, curing or derivatives are to be understood to include any process that transforms material or materials in one state to the same or different material or materials in a solid state. Different materials may require different curing techniques or curing conditions.

The preferred printhead is a Micro Electro Mechanical System (MEMS) type printhead in which a material is ejected from a chamber under the control of a movable element. Reference is made to the following patent specifications that disclose numerous such MEMS type printheads or printhead components:

| | | | | | |
|---|---|---|---|---|---|
| 6227652 | 6213588 | 6213589 | 6231163 | 6247795 | 6394581 |
| 6244691 | 6257704 | 6416168 | 6220694 | 6257705 | 6247794 |
| 6234610 | 6247793 | 6264306 | 6241342 | 6247792 | 6264307 |
| 6254220 | 6234611 | 6302528 | 6283582 | 6239821 | 6338547 |
| 6247796 | 6557977 | 6390603 | 6362843 | 6293653 | 6312107 |
| 6227653 | 6234609 | 6238040 | 6188415 | 6227654 | 6209989 |
| 6247791 | 6336710 | 6217153 | 6416167 | 6243113 | 6283581 |
| 6247790 | 6260953 | 6267469 | 6273544 | 6309048 | 6420196 |
| 6443558 | 6439689 | 6378989 | 6848181 | 6634735 | 6623101 |
| 6406129 | 6505916 | 6457809 | 6550895 | 6457812 | 6428133 |
| 6390605 | 6322195 | 6612110 | 6480089 | 6460778 | 6305788 |
| 6426014 | 6364453 | 6457795 | 6315399 | 6338548 | 6540319 |
| 6328431 | 6328425 | 6991320 | 6595624 | 6417757 | 7095309 |
| 6854825 | 6623106 | 6672707 | 6588885 | 7075677 | 6428139 |
| 6575549 | 6425971 | 6383833 | 6652071 | 6793323 | 6659590 |
| 6676245 | 6464332 | 6478406 | 6439693 | 6502306 | 6428142 |
| 6390591 | 7018016 | 6328417 | 6322194 | 6382779 | 6629745 |
| 6565193 | 6609786 | 6609787 | 6439908 | 6684503 | 6755509 |
| 6692108 | 6672709 | 7086718 | 6672710 | 6669334 | 7152958 |
| 6824246 | 6669333 | 6820967 | 6736489 | 6719406 | 10/728804 |
| 7128400 | 7108355 | 6991322 | 10/728790 | 7118197 | 10/728970 |
| 10/728784 | 10/728783 | 7077493 | 6962402 | 10/728803 | 7147308 |
| 10/728779 | | | | | |

Such MEMS type printheads may utilize different ejection mechanisms for different ejectable materials while other MEMS printheads may utilize different movable shutters to allow different materials to be ejected under oscillating pressure. It is to be understood that whilst MEMS type printheads are preferred, other types of printhead may be used, such as thermal inkjet printheads or piezoelectric printheads.

The aforementioned patents disclose printhead systems for printing ink, but it will be appreciated that the systems disclosed may be modified to print other materials.

In the preferred embodiments the data for each layer is stored in memory on or in or associated with the layer group that prints that layer. Preferably each layer group also stores data relating to at least the preceding layer. Thus if an earlier layer group fails, successive layer groups can all, synchronously, change to printing the respective preceding layer.

Preferably, after such a change in which layer(s) a layer group or groups are printing, the system may automatically transfer layer data from one layer group to another so as to restore the layer groups to having data relating to at least the preceding layer compared to the actual layer being printed.

In the preferred embodiments each voxel has dimensions in the order of 10 microns, each layer of the products is about 10 microns high and in a typical system we have about 1000 separate sub-systems, each creating a separate layer of separate items. Thus products up to about 1 cm high may be created on a typical production line of the preferred embodiments.

Each printhead nozzle ejects a droplet that forms, when frozen, dried or cured, a volume element (Voxel) that is approximately 10 microns high. The printheads typically print up to about 30 cm in width and so print up to about 30,000 droplets in each line across the substrate. In the preferred embodiments the voxels are treated as being hexagonal in plan view with an effective height of about 10 microns.

If we have a system with 1000 layer groups, each of which is capable of printing 30,000 voxels transversely and 60,000 voxels longitudinally, we have a volume of 1800,000,000,000 voxels. Within that volume we can define as many or as few different products as we desire that will fit in that volume. Where multiple products are defined within that volume, their design need not be the same. We could, for example, define 1000 products within the volume, each with its own different design. Products may be located transversely, longitudinally and vertically relative to other products. Thus products may be created on top of each other, not just side by side or end on end.

The preferred embodiments have a print width of about 295 mm, a substrate speed of about 208 mm and an ability to print about 1000 layers, each of which is about 10 microns thick. Thus the preferred embodiments are able to print products that have a thickness up to about 1 cm and one of the height and width no more than 295 mm. The other of the height and width may be up to about 600 mm. As will be explained later, this dimension is limited by memory considerations.

Product Samples

Examples of products that may be manufactured using embodiments of the invention include small electronic devices, such as personal digital assistants, calculators through to relatively large objects, such as flat panel display units. The productivity of a production line is exemplified by the following examples.

Personal Digital Assistant

An example product that may be produced by a system of the present invention is a personal digital assistant (PDA) such as those made by Palm Inc of Milpitas, Calif. USA. A typical PDA has dimensions of 115 mm×80 mm×10 mm (H×W×D). Using hexagonal voxels 10 microns high and with a side length of 6 microns, a total of about 98 billion voxels are required to define each product. This requires approximately 98 Gbytes of data, if we assume that eight different materials are used in the product.

At a substrate speed of 208 mm per second a typical production line can produce approximately 4.32 products per second, 373151 products per day or 136 million products per year, assuming the system runs continuously. Whilst this is greater than the current market for such products, the system has the potential to substantially reduce the cost of these products and so increase the market.

Whilst the system may print polymer transistors and displays, these have lower performance than silicon based transistors and displays. However, as discussed elsewhere, the system is designed to allow incorporation of made up components into partially printed objects in the production line.

Flat Panel TV

A flat panel TV of 53 cm diagonal size is generally the largest object that can be printed in the typical system. Of course to print wider objects, wider printheads may be utilized. For longer objects, more memory is required and for thicker objects the voxel height maybe increased or more layers printed by providing more layer groups. Whilst the printheads have the ability to vary the droplet size slightly, generally if a larger voxel size were required, different printheads would be required. Of course increased voxel size results in a higher 'roughness' of the finished product. However, depending on the product, this may be commercially acceptable.

A typical 53 cm flat panel TV has dimension of 450 mm×290 mm×10 mm (H×W×D). Using hexagonal voxels 10 microns high and with a side length of 6 microns, a total of about 1395 billion voxels are required to define each product. This requires approximately 1395 Gbytes of data, if we assume that eight different materials are used in the product.

At a substrate speed of 208 mm per second a typical production line can produce approximately 0.37 products per second ($^{208}/450{=}0.46$), 31890 products per day or 12 million products per year, assuming the system runs continuously.

The complexity that may be defined by over 1 terabyte of data is much greater than required by a typical flat panel TV and the amount of functionality that can be built-in could be very great. There are very few discrete objects that would need to be incorporated into the part-printed product.

From the foregoing it is apparent that the invention thus has many embodiments and accordingly has many broad forms.

In a first broad form the invention provides a three dimensional object creation system that prints objects layer by layer, the system printing at least part of each of multiple layers simultaneously.

In a second broad form the invention provides a three dimensional object creation system that prints objects layer by layer, the system printing at least part of each of multiple layers simultaneously,
   wherein each layer is defined by a plurality of voxels arranged in a regular array and wherein the voxels of each layer are printed so as to be offset by half a voxel relative to the voxels of adjacent layers in a first direction, a second direction perpendicular to the first direct ion or both the first and second directions.

In a third broad form the invention provides a three dimensional object creation system that prints objects layer by layer, the system including a plurality of printheads, the system printing at least part of each of multiple layers simultaneously,
   wherein the printheads are configured to enable printing of at least two different materials in at least one layer.

In a fourth broad form the invention provides a three dimensional object creation system that prints objects layer by layer, the system including a plurality of printheads, the system printing at least part of each of multiple layers simultaneously,
   wherein the printheads are configured such that at least one of the layers may be printed with a first set of materials and at least one other of the layers may be printed with a second set of materials, and
   wherein the first and second sets are not the same.

Preferably more than 100 layers are printed simultaneously and more preferably about 1000 layers are printed simultaneously.

Preferably pluralities of objects are simultaneously printed.

When completed, the objects may have substantially identical designs.

Preferably each of the layers that are at least partially printed simultaneously is for at least one different object.

Each printhead may print part or all of a predetermined layer.

Multiple layers of the same material may be printed

Multiple materials may be incorporated in each layer.

Preferably the printheads are inkjet printheads and more preferably the printheads are fixed inkjet printheads able to simultaneously print the width of the objects.

Droplets of material printed may be printed in a hexagonal close-pack configuration or a face centered cubic configuration.

In a fifth broad form the invention provides a three dimensional object creation system that prints objects layer by layer, the system including a plurality of printheads, the system printing at least part of each of multiple layers simultaneously, the system configured to enable at least one first printhead that is initially configured to print at least part of a first layer to be dynamically reconfigured to print at least part of a second layer.

Preferably the at least one first printhead is dynamically reconfigured if at least one of the at least one printhead initially configured to print the second layer fails.

Preferably if a printhead initially configured to print the second layer fails whilst printing the second layer, the at least one first printhead is reconfigured to complete the printing of at least part of said second layer.

In a sixth broad form the invention provides a three dimensional object creation system that prints objects layer by layer, the system including a plurality of printheads, the system printing at least part of each of multiple layers simultaneously, the system configured to enable at least one first printhead that is initially configured to print at least part of a first layer to be dynamically reconfigured to print at least part of a second layer, and wherein if at least one printhead initially configured to print the second layer fails whilst printing said second layer, said at least one first printhead is dynamically reconfigured to complete the printing of at least part of said second layer.

Preferably the reconfiguration is made with no loss of printed product.

Preferably the system includes a fault detection system that automatically detects faults in said system and reconfigures said at least one first printhead in the event of a failure.

In a seventh broad form the invention provides a three dimensional object creation system that prints objects layer by layer, the system including a plurality of printheads, the system printing at least part of each of multiple layers simultaneously, the system including semiconductor memory and wherein data defining at least one layer is stored in the semiconductor memory.

Preferably the data defining all of the layers is stored in the semiconductor memory.

Preferably each printhead includes at least some of the semiconductor memory and more preferably the semiconductor memory of each printhead stores data relating to at least the part of the layer printed by the printhead.

Preferably the semiconductor memory of each printhead stores data relating to at least part of at least another layer and more preferably the semiconductor memory of each printhead stores data relating to at least part of the previous layer compared to the layer currently being printed by the respective printhead.

The system may include more than 10 Gbytes of semiconductor memory.

In a eighth broad form the invention provides a system that executes a process, the system including a plurality of subsystems, each of which performs a stage of the process, each of the subsystems configured to perform one of a first subset of $N_1$ of the stages, where N is greater than 1, and to change the stage of the subset being performed on receipt of a change instruction;

wherein, in the event that one of the subsystems fails, at least one of the remaining subsystems synchronously changes to performing the respective stage of the failed subsystem without requiring transfer of data relating the respective stage to the said at least one remaining subsystems, and when a subsystem changes to performing a different stage, the system reconfigures the subsystem to be capable of performing a second subset $N_2$ of the stages where $N_1$ and $N_2$ have the same number of stages.

The system may be a pipelined system in which each stage is dependent on the successful completion of all previous stages.

Preferably another subsystem is instructed to perform the stage previously carried out by the first subsystem.

The reconfiguration may occur by way of replacement of a component or, in preferred forms, by way of data transfer.

Preferably each stage is defined by a data set and each subsystem stores a plurality of data sets. When performing a stage the subsystem accesses the corresponding data set. To change the stage being performed, the subsystem merely changes the data set being accessed. Preferably when a subsystem changes the stage being performed, the data set relating to the stage previously being performed is replaced by data relating to a stage not already in that subsystem's memory.

In preferred systems, when a subsystem fails, all subsequent subsystems in the process change the stage being performed and, when reconfiguration involves a transfer of data, preferably this occurs as a pipelined data transfer.

In a ninth broad form the invention provides a printing system including a least two printheads, wherein a first printhead is actively maintained at a first temperature and a second printhead is actively maintained at a second temperature.

Preferably the system is a three dimensional object creation system that prints objects layer by layer, the system including a plurality of printheads, the system printing at least part of each of multiple layers simultaneously.

Preferably the first printheads is configured to eject a metal and the first temperature is above the melting point of the metal.

In a tenth broad form the invention provides a printing system including a least two printheads, a first one of the printheads printing a first material and a second one of the printheads printing a second material, the first material being cured by a first method and the second material being cured by a second method and wherein the first and second methods are different.

The first and second methods may include at least one method selected from a group including: evaporative drying; freezing of material ejected when molten; ultra violet curing; addition of a curing agent.

The first and second methods may include printing of a curing agent simultaneously or sequentially with the respective material.

The first and second methods may include printing of a curing agent selected from a group including: a catalyst; a polymerization initiator; a compound that reacts with the respective material.

The system may be a three dimensional object creation system that prints objects layer by layer, the system printing at least part of each of multiple layers simultaneously.

In an eleventh broad form the invention provides a printing system including
- at least one printhead for printing material to create a printed product, and
- an object incorporation device that incorporates inorganic semiconductors into the product being printed whilst the at least one printhead prints the product.

The inorganic semiconductor may be an integrated circuit.

The inorganic semiconductor may comprises silicon.

The inorganic semiconductor may comprise a Group III-V semiconductor.

The inorganic semiconductor may comprises a discrete device.

The inorganic semiconductor may be selected from a group including: transistor; light-emitting diode; laser diode; diode or silicon controlled rectifiers (SCR).

The system may be a three dimensional object creation system and may be a three dimensional object creation system that prints objects layer by layer, the system printing at least part of each of multiple layers simultaneously.

In a twelfth broad form the invention provides a system that prints three dimensional products, the system including
- at least one object incorporation device that incorporates non-printed objects into partially completed product, the non-printed objects not being printed by the system.

The system may include at least one printhead for printing material to create a printed product and operate so that non-printed objects are incorporated into partially completed product whilst the at least one printhead prints the product.

Preferably the non-printed objects are incorporated into partially completed product without stopping the printing process.

Preferably the non-printed objects are incorporated into the partially completed product at a predetermined position and/or a predetermined orientation on or in the product.

The system may print electrical connectors to electrically connect the non-printed objects to other parts of the product.

The system may print at least part of each of multiple layers simultaneously. More preferably the system simultaneously prints objects layer by layer.

In a thirteenth broad form the invention provides a system that prints three dimensional products, the system including
- an object incorporation device that inserts non-printed objects into a cavity created during the printing process, the object incorporation device incorporating the non-printed object into the cavity during the printing of the respective printed object.

Each cavity may be created with substantially the same height as the non-printed object to be inserted into the respective cavity.

Each cavity may be sized so that after insertion of the object, the top of the non-printed object is substantially flush with the surrounding material of the partially completed product.

Each cavity may be shaped to maintain at least one of the position and orientation of the non-printed object and preferably both.

The shape of each cavity may substantially match the shape of the non-printed object.

The system may print at least part of each of multiple layers simultaneously. More preferably the system simultaneously prints objects layer by layer.

In a fourteenth broad form the invention provides a system that prints three dimensional products, the system including at least one printhead that prints electrical connections to at least one object incorporated in the products.

Preferably the at least one object does not include a substrate.

A drop on demand printing subsystem preferably prints the electrical connections.

The electrical connections are preferably printed with molten metal.

The system may print at least part of each of multiple layers simultaneously. More preferably the system simultaneously prints products layer by layer.

It will be appreciated that the features of the various broad forms of the invention may combined together in any combination and are not limited to any one specific broad form.

DETAILED DESCRIPTION OF PREFERRED AND OTHER EMBODIMENTS

Basic Concept

Figure 1:
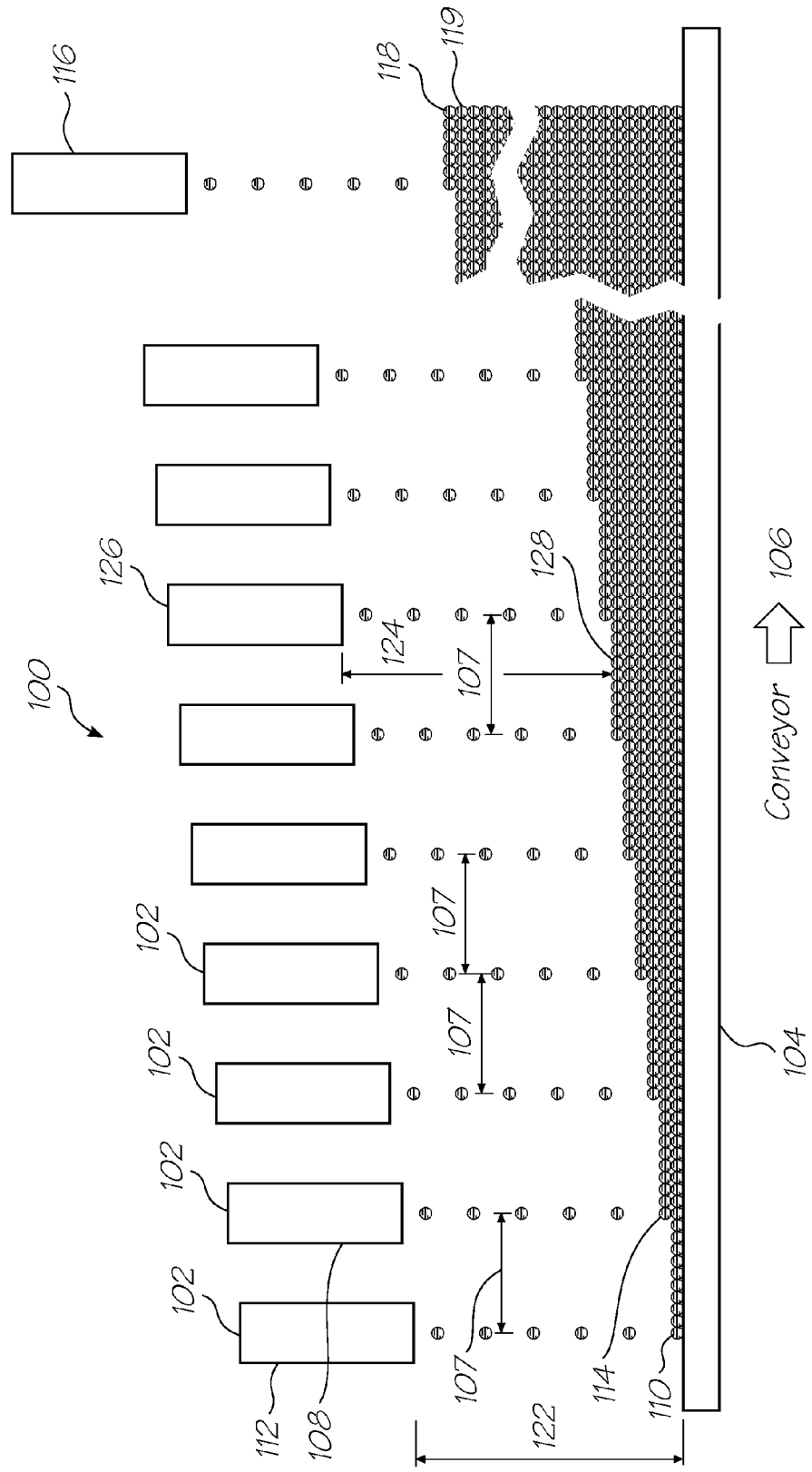
FIG. 1 shows a schematic side view of a production line according to a first embodiment of the invention.

FIG. 1 schematically shows a simplified production line 100 having many substrate width printheads 102.

The printheads 102 print materials onto a moving substrate 104, that is preferably moved at a substantially constant speed in a flat plane, as indicated by arrow 106. The printheads 102 extend across the width of the substrate 104 perpendicular to the direction of travel of the substrate and are, preferably, spaced along the substrate 104 with substantially constant separations. However, as will be explained later, constant separation of the printheads is not critical.

The printheads 102 print one layer of an object onto the previously printed layer. Thus the printhead 112 prints the first layer 110, the second printhead 108 prints a second layer 114 onto the first layer 110 and the $N^{th}$ printhead 116 prints an $N^{th}$ layer 118 onto the $(n-1)^{th}$ layer 119. For clarity only one printhead is shown for each layer but in practice there will be multiple printheads for each layer.

The layers are of a constant thickness and the printheads are controlled so that, in plan view, layers are printed on top of each other.

The distance from each of the printheads to the surface upon which they print is also preferably the same for all printheads. Thus the distance 122 from the first printhead 112 to the substrate 104 is preferably the same as the distance 124 from the seventh printhead 126 to the sixth layer 128. This may be achieved by sequentially raising the printhead(s) for each layer by the voxel height. In this situation, droplets ejected by printheads for different layers at exactly the same time will arrive at their destinations at the same time.

Voids

A product may be produced with voids and/or cavities. These voids may be utilized for location of separately created objects that are inserted into the cavities during production. The cavities may also be provided as fluid passageways or for other purposes and remain 'empty' of printed or inserted materials in the finished product.

Cavities that have substantially vertical walls and a roof can only have the roof printed where there exists solid material in the cavity. Where an object is inserted, obviously the object provides the solid surface onto which roof material may be printed. Where the cavity is to be 'empty' in the finished product, it is necessary to provide a sacrificial material, such as wax, to provide a solid surface on which the roof material may be printed. The sacrificial material is then removed by further processing after the roof has been formed.

It will be appreciated that many cavity shapes do not require a sacrificial material and the roof may be closed up gradually one layer at a time. Examples of such shapes include ovals and circles, polygons having an odd number of sides, and other shapes that do not have a horizontal roof portion significantly greater than the voxel size.

Figure 8:
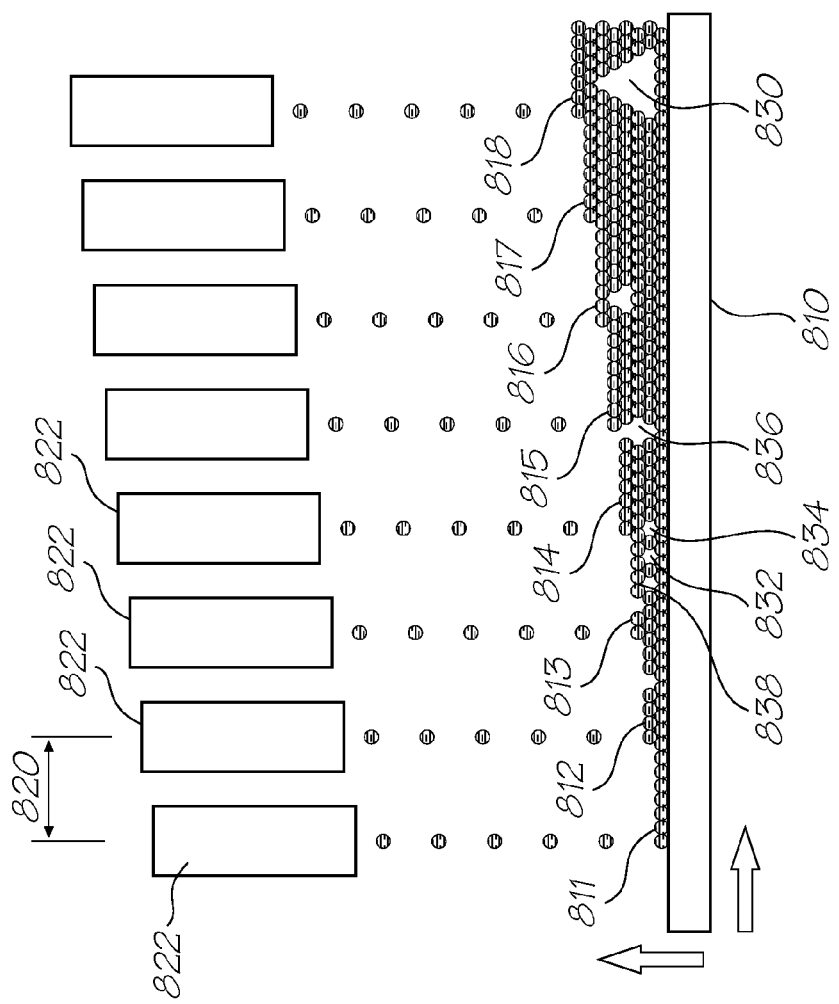
FIG. 8 shows a side view of the arrangement of layers of voxels produced by preferred embodiments.

FIG. 8 shows a product that has had a number of different cavities or voids formed in various layers. A triangular cavity 830 has been formed that spans 5 layers. As can be seen, printing successive layers with a smaller opening may close the cavity. The cavity 830 may extend as a passageway through the product and may extend vertically and/or longitudinally, not just transversely. FIG. 8 also shows cavities 832, 834 and 836 that are formed by not printing in a single layer. Cavity 836 is shown partially completed and, in cross section has a diamond shape. When the fifth layer is completed, the cavity will be closed.

It will be appreciated that the drawing is not to scale and in practice cavities may extend for 10's of voxels in either the transverse or longitudinal direction and may also extend for 10's of layers.

Multiple Materials

Whilst a system that only prints one material is within the scope of the invention, to produce functional products made of many different materials, the ability to print several different materials on a layer is required. In preferred embodiments this is achieved by providing multiple printheads for each layer, with at least one printhead printing a different material compared to the other printheads provided for that layer.

Figure 2:
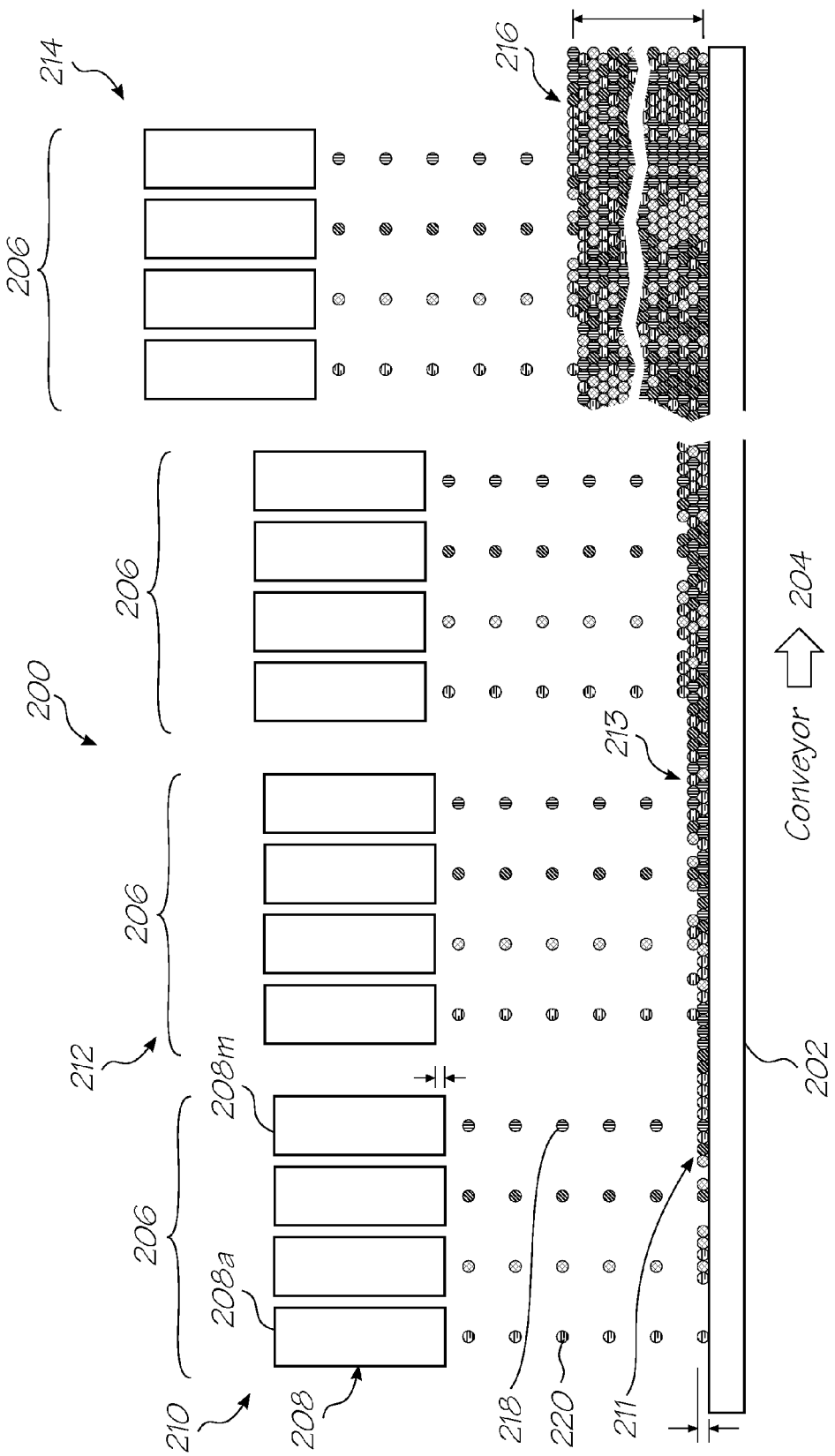
FIG. 2 shows a schematic side view of a production line according to a second embodiment of the invention.

Referring to FIG. 2 there is schematically shown a digital additive manufacturing system 200 for simultaneously creating multiple multi-material products, one layer at a time. For clarity some components are omitted.

The products printed simultaneously may all be of an identical design or may be of different designs, depending upon data supplied to the printheads. Different designs of products may be printed side by side and/or end on end or on top of each other. Products may be printed on top of each other using sacrificial material(s) as separating layer(s).

The system 200 includes a conveyor or substrate 202 that is caused to move at a substantially constant velocity as indicated by an arrow 204. The substrate 202 may be directly driven or may be located on a conveyor system, not shown. The substrate 202 preferably moves in a flat plane. Movement along a non-flat plane is also possible. A continuous substrate is preferred as this ensures a consistent velocity past all the printheads. However because discrete objects are created, a series of discrete carriers could be conveyed past the printheads.

Located above the substrate 202 and spaced apart form each other are a series of "layer groups" 206 of printing devices. Each layer group 206 includes m printheads 208, which extends transversely across the substrate 202 perpendicular to the direction of travel of the substrate. There may be more than one printhead in each layer group; for a typical system there will be an average of around eight printheads in each layer group. For clarity the drawings only show four printheads in each layer group. There is no theoretical limit to the number of printheads in each layer group. In the embodiment of FIG. 2 the layer groups are identical to each other.

The materials printed by the printheads may include different polymers, different colored polymers, metals, sacrificial materials such as wax, various evaporative drying materials and various two part compounds. A suitable metal that may be used is indium, which has a melting point of 156° C. Alloys of Indium and Gallium may be used, with melting points below 156° C. It will be appreciated that other metals or metal alloys may be used. The ability to print metal enables high conductivity electrical connections to be printed. Polymers having melting points in the range of about 120° C. to 180° C. are preferred, but other polymers may be used. Sacrificial waxes having a melting point of above 80° C. are preferred. Other compounds may be printed.

The layer groups 206 are spaced apart along the longitudinal direction in which the substrate 202 moves. The spacing of the layer groups 206 from each other is preferably substantially constant but this is not essential. The layer groups 206 are spaced vertically from the substrate 202 and this vertical separation preferably increases stepwise with each layer group in the longitudinal direction by P for each layer group. Thus, the $m^{th}$ layer group will preferably be $\beta(m-1)$ further away from the substrate 202 than the first layer group, where $\beta$ is the increase in vertical separation per layer group. The value of $\beta$ is preferably at least the voxel height $\alpha$, approximately 10 microns. The step value may be greater than the voxel height $\alpha$ but in most embodiments cannot be less than the voxel height. A value greater than $\alpha$ merely results in the printhead to printing surface increasing. A value less than a may result in products contacting the printheads unless the initial vertical spacing is sufficiently large. However, in practice the printhead to surface distance is significantly less than the finished product height. So $\beta$ needs to be the same or greater that the voxel height α. The printheads of each layer group are preferably the same distance from the substrate so that they may be synchronized to a single clock and so preferably β is equal to α. Variations in vertical position of individual printheads in each layer group may be compensated for by adjusting when each of the printheads operate.

As the substrate 202 moves in the direction of arrow 204, all of the layer groups operate simultaneously, so that each layer group lays down a single layer of material or materials of the products being created. By simultaneously we mean the printheads operate at substantially the same time; we do not mean that the printheads eject material at exactly the same time. In fact, because the printheads of a single layer group are spaced along the path of travel, by necessity they must eject material at different times.

The first layer group 210 prints material directly onto the substrate 202 to form a first layer 211. Thus as the substrate passes under the second layer group it will already have material printed by the first layer group. Thus the second layer group 212 prints a second layer of the object onto that first layer. In normal operation each layer group prints a layer onto the layer printed by the previous layer group so that the $n^{th}$ layer group 214 prints an $n^{th}$ layer 216 of the object.

If the spacing of the layer groups along the substrate is constant and a single type of object is being produced, the front edge of all the objects being simultaneously created by the production line will pass under the first printhead of each layer group at the same time. If the distances between the first printhead of each layer group and the surface upon which material ejected by that printhead are substantially identical, then the time that material spends traveling from the printhead to the deposition surface is also the same between the layer groups. Thus, the layer groups may be synchronized to run off a single clock without, in normal use, the need for delays in the clock cycles between layer groups. As will be explained later, the system is designed to operate with variations with longitudinal spacing between adjacent operating layer groups and constant longitudinal spacing or vertical rise is only preferred and is not always critical.

To maintain a substantially constant step height between layer groups, the printheads of the layer groups may be mounted directly or indirectly on two longitudinally extending support beams. Assuming the beams are substantially straight, for a production line of 1000 layer groups, raising the downstream end of the beams 1 cm compared to the upstream ends will result in a step height for each layer group of 10 micron, assuming there is a constant spacing between the layer groups and the layer groups are all the same size in the longitudinal direction. Where there are multiple printheads in a layer group the printheads may be mounted individually to the beams or may be mounted on a common carrier with the carrier mounted on the beams. Mounting the printheads of each layer group on a common carrier allows the printheads to be more easily located substantially in a single plane. In use the plane is also preferably substantially parallel to the substrate. This allows the printheads of a layer group to have a common printhead to printing surface distance where the substrate moves on a plane. The use of a common carrier also allows the printheads of a layer group to be assembled on the carrier away from the production line with the longitudinal spacing between printheads accurately controlled. Location of the printheads on the beams then merely requires accurate location of the carrier. Replacement of a failed layer group is also easier.

The multiple printheads of each layer group are for printing a single layer but they are spaced apart from each other. Referring to FIG. 2, material 218 printed by the $m^{th}$ printhead 208$m$ may need to be printed adjacent to material 220 printed by the first printhead 208$a$ of a layer group. This is achieved by delaying printing of voxels by the $m^{th}$ printhead 208$m$ compared to those printed by the first printhead 208$a$. This time delay corresponds to the time the substrate 202 takes to move from the first printhead 208$a$ to the $m^{th}$ printhead 208$m$, i.e. the separation of the printheads divided by the speed of the substrate 202. Since both the substrate speed and the longitudinal separation of printheads in a layer group may vary, the time delay is not necessarily constant. This may be due to temperature variations, variations in location of printheads and other factors. Accordingly the system may include sensors that feed data such as temperature, substrate speed or printhead separation into the timing circuits.

Print Temperatures

Each of the different materials used may require different printing and/or post printing processing temperatures compared to the temperatures required for the other materials. The actual printing temperatures and post printing processing temperatures depend on the materials used and so it is conceivable that a multi material production line could run at one temperature, albeit unlikely. It also follows that not only must the materials used must be compatible with the other materials during printing, processing and in the finished product, but that the printing and processing temperatures must be generally compatible.

Figure 3:
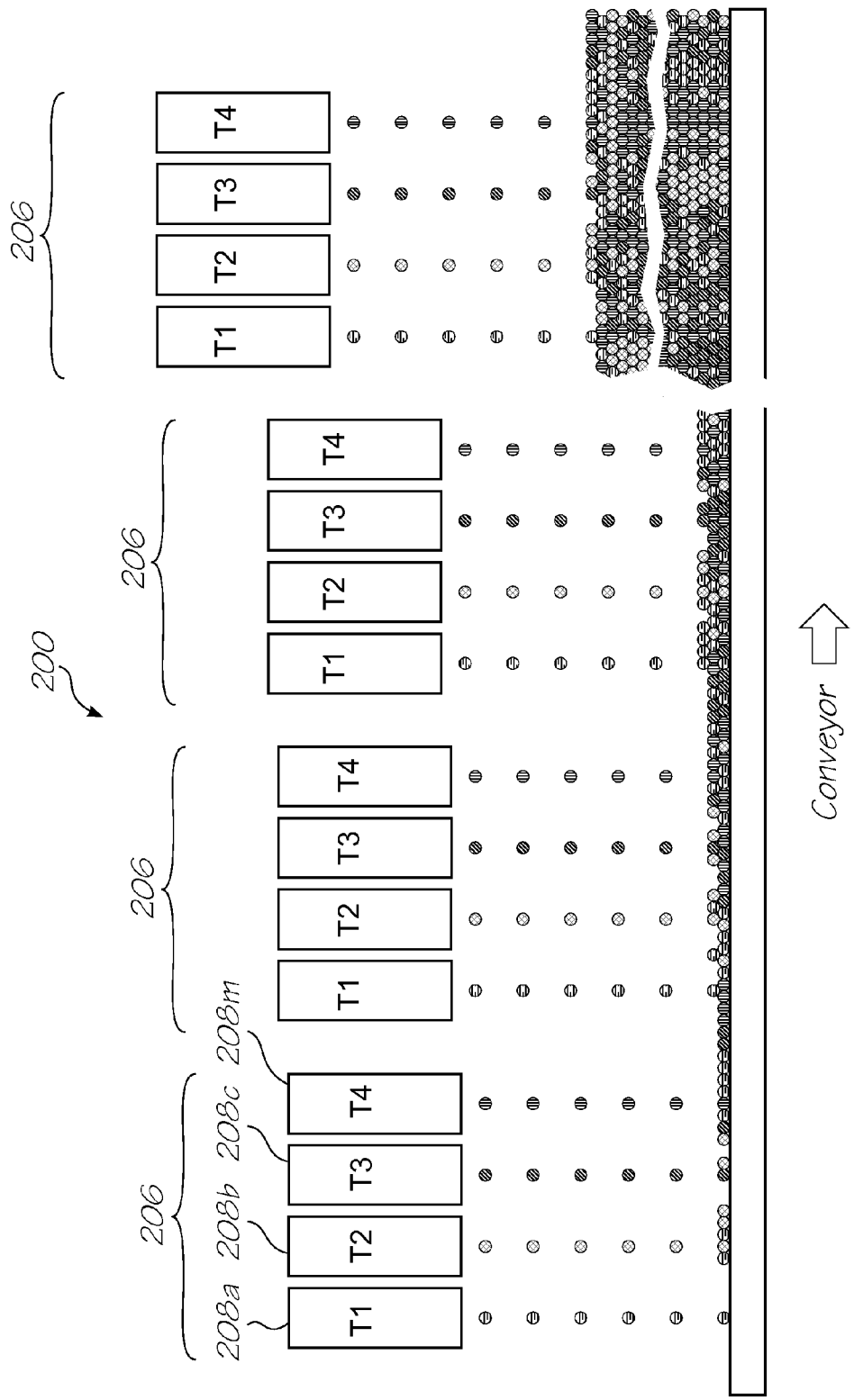
FIG. 3 shows another schematic side view of the production line of FIG. 2.

FIG. 3 shows the production line of FIG. 2 but indicating print temperatures.

The printheads of each layer group 206 may print several different materials, typically materials that are heated above their melting points. Accordingly, one printhead may print indium metal at a temperature of 180° C. Sacrificial wax having a melting point of about 80° C. or lower may be printed by another printhead to enable the formation of voids. If both indium and wax are printed, the evaporative temperature of the wax will need to be below the melting point of indium (156° C.). If the evaporation temperature of the wax were above 156° C., when the product is heated to evaporate the wax, the indium metal would melt. Accordingly, a wax with an evaporative temperature below 156° C. (or the lowest melting point of all other materials used) must be used. The wax also cannot be heated to 180° C. for printing, as at that temperature it is a vapor. Accordingly, the printhead printing the wax will need to be at a temperature of about 80° C. whilst the indium printhead will need to be at about 180° C. Similar considerations apply when printing materials that are printed in solution and the solvent evaporates to "cure" the material. These materials may well be printed at room temperature.

FIG. 3 shows the first printhead of each layer group, such as printhead 208$a$, prints a first material $M_1$ at a temperature $T_1$. The second printhead of each group, such as printhead 208$b$ prints a second material $M_2$ at a temperature $T_2$, etc. The $m^{th}$ printhead of each group, such as printhead 208$m$ prints material $M_m$ at temperature $T_m$. Some of the values of $T_1$ to $T_m$ may be the same.

Whilst reference is made to the melting point of other materials, it will be appreciated that some materials, either before or after printing or curing, may undergo undesirable temporary or permanent changes if raised about certain temperatures. If so, the system needs to be configured to avoid subjecting those materials to temperatures above the relevant thresholds.

The temperatures of the materials printed and the temperature of the exposed layer needs to be maintained within ranges. The concept of the invention hinges on voxels bonding to adjacent voxels to form a product of acceptable strength and durability. Thus, for instance, a droplet of indium metal may be printed onto a voxel of indium metal or a plastics material. The droplet of indium will need to be heated to a temperature sufficiently above its melting point so that it may melt part of the indium upon which it lands to forming a good mechanical and electrical bond. However, the indium should not be so hot that it melts too much of the material that it contacts or otherwise irreversibly changes the material that it contacts. It will be appreciated that the requirements for good bonding and avoiding damage to previously printed material can be accommodated by adjusting the temperature of material being printed and the temperature of the material that has been printed, as well as by appropriate selection of materials.

Curing Methods

Figure 4:
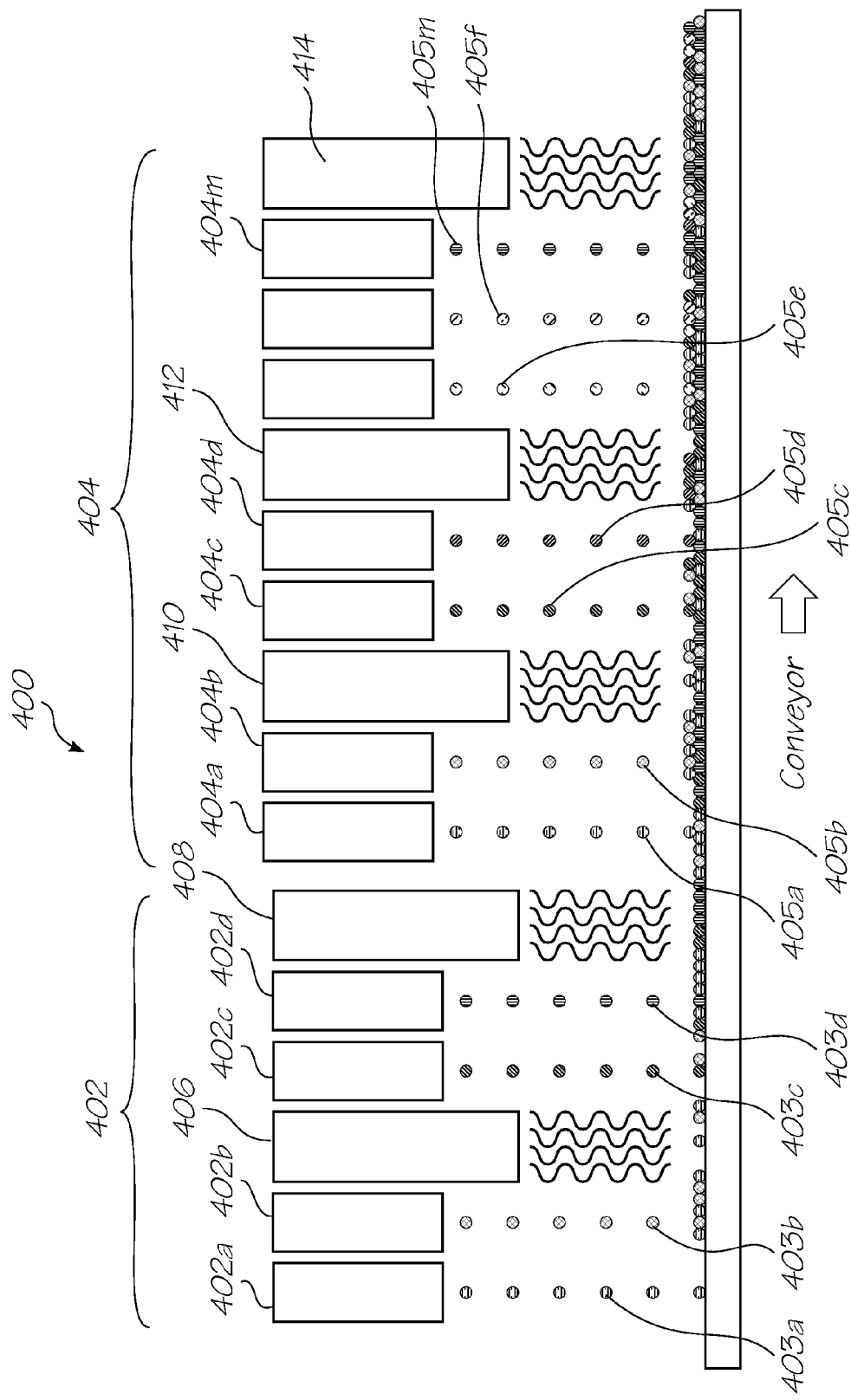
FIG. 4 shows a schematic side view of the production line according to a third embodiment of the invention.

Different materials printed by the system may require a number of different curing techniques. Two or more materials usually share a drying/curing technique. FIG. 4 also schematically shows a number of different curing techniques.

Curing requirements include simple cooling to cause a material to solidify, evaporative drying, precipitation reactions, catalytic reactions and curing using electromagnetic radiation, such as ultra violet light.

The materials of each layer need to be cured to a sufficient degree to be dimensionally stable before the materials of the next layer are deposited. Preferably the materials are fully cured before the next layer is deposited but need not be. For example a material printed as a hot melt may have cooled to be sufficiently 'solid' to allow the next layer to be printed whilst not being fully solidified. Examples include materials that do not have a specific melting point but solidify over a temperature range.

Curing may occur after all materials in a layer have been printed or may occur at different stages. Thus, in some embodiments, each layer group may include one or more mechanisms for effecting curing of the materials printed that are located between printheads of each group.

FIG. 4 shows two layer groups of n layer groups of a system 400. The first layer group 402 has four printheads 402a, b, c & d requiring two different curing methods. The second layer group 404 has m printheads printing m materials requiring j different curing methods. Disposed within the printheads are curing mechanisms for carrying out appropriate curing methods. The printheads are preferably arranged so that materials requiring the same curing method are grouped together upstream of a single corresponding curing mechanism.

The materials 403a, 403b of printheads 402a and 402b require a first curing method and are located upstream of curing mechanism 406, which carries out curing of materials 1 and 2 as they pass underneath. The materials 403c and 403d printed by printheads 402c and 402d share a second curing method and so are preferably grouped together upstream of curing mechanism 408. Thus the materials printed by printheads 3 and 4 may be cured as they pass under curing mechanism 408.

Similarly, the second layer group 404 has materials that require three different curing methods. Printheads 404a and 404b print materials 405a and 405b that require curing by the first curing method and are located upstream of curing mechanism 410. The third and fourth printheads 404c and 404d print third and fourth materials 405c and 405d that are cured by curing mechanism 412. Finally, the fifth to $m^{th}$ printheads print materials that require a $j^{th}$ curing method, which is effected by the curing mechanism 414.

By grouping the printheads of materials that share common curing techniques together, only a single curing mechanism for each curing method is required in each layer group. Whilst this is preferred, there is nothing to prevent an arrangement where one curing method is carried out by more than one curing mechanism in each layer.

It will be appreciated that curing methods may conflict and so the order of printing within each layer group will require consideration to ensure a curing method does not adversely affect other materials already printed, whether cured or uncured.

In some circumstances all curing devices may be located between layer groups.

Examples of curing methods include, but are not limited to, the following:

Evaporative Drying.
Freezing of ejected material.
Ultra violet initiated curing using U.V. lamps.
Printing of reagents.
Printing of catalysts or polymerization initiators.

Evaporative Drying.

Evaporative drying may be assisted by passing a hot or dry (solvent depleted) gas over the material, applying a vacuum or low gas pressure to the material or by heating, such as by infrared radiation or combinations of these. It will be appreciated that by 'dry' gas we mean gas that has a relatively low partial vapor pressure of the relative solvent, whether that solvent is water, alcohol, another organic solvent, an inorganic solvent, etc.

Freezing of Ejected Material.

Freezing of ejected material that has been heated above its melting point is applicable to metals, polymers and waxes. Cooling may rely on conduction and/or radiation of heat only or may be enhanced by blowing of cold gas over the layer or any other method of forced cooling to speed heat removal. Since the preferred production line has of the order of 1000 layer groups, conduction and radiation alone will not usually allow sufficient heat loss and so forced cooling will be required in most situations. As each layer needs to be cooled, gas(es) will normally be caused to move transversely across the objects. Cooling gases may be introduced on one side of the system and caused to flow across the object to the other side. Alliteratively gas may be introduced above the objects and caused to flow to both sides of the object. It will be appreciated that these are examples and other systems for gas flow may be utilized. It will be understood that 'cold' is relative and the gases used may be at or above ambient temperature.

Where gas is passed over the layer, either for evaporative drying or for freezing, it will be appreciated that the gas will need to be compatible with the material or materials being cured. Where metals are printed, the metal droplets will, generally, need to fuse with adjacent metal droplets, either in the same layer or in adjacent layers. As such an inert gas, such as nitrogen, will be needed for cooling so as to avoid oxidation.

In most circumstances material ejected as hot melt needs to be cooled not only below its freezing temperature but also to the freezing temperature of all the materials printed. Potentially any of the materials may be printed next to or on top of any other material. As an example, indium metal may be printed in part of one layer and the next layer may have sacrificial wax printed onto the indium metal of the earlier layer. Whilst the indium could be cooled to about 150° C. to be frozen, this would be too high for a sacrificial wax with a melting point of about 80° C. Thus, the indium would need to be cooled to below 80° C. in this case before reaching the next layer group. In addition, sacrificial wax may be printed in the same layer and adjacent to indium metal. In this case the indium metal would need to be cooled below the melting point of the wax before reaching the wax printhead of the same layer group. It will be appreciated that a first voxel of material may be heated by a nearby second voxel even though the two voxels are not in physical contact with each other. Whilst wax has been used as an example of a material having a low melting point, it will be appreciated that the above discussion is applicable to all materials.

The effect of high temperatures is not limited to possible melting. High temperatures may also affect materials that are cured by other methods, such as evaporation, catalytic reactions or polymerization reactions.

It follows from the above discussion that, in most situations, materials that require a high processing temperature, whether due to being printed as a hot melt or due to post printing processing, will need to be printed, processed and cooled to an acceptable temperature before printing of potentially affected materials in the same layer, not just in the next layer.

Ultra Violet Initiated Curing Using U.V. Lamps.

Ultra violet curing may be used with U.V. cured polymers. To achieve rapid curing high intensity U.V. lamps may be used. To avoid overheating forced cooling by passing cooled gas may also be required.

Printing of Reagents and Catalysts or Polymerization Initiators.

Reagent printing includes printing of two part polymers or mixtures in which a precipitation reaction occurs. This may require special printheads to print the two compounds simultaneously or the use of two, preferably adjacent, printheads, that each print one of the compounds. Similarly, use of catalysts or polymerization initiators requires printing of the material and a catalyst or polymerization initiator. Thus, again, special 'dual' printheads or two printheads may be required for each such material.

Where a solid material is produced by use of catalysts, polymerization initiators, two part polymers, precipitation reactions or other mechanisms that require two separate components to be printed separately, the two components may be printed to the same location or may be printed to adjacent locations with mixing occurring through contact of adjacent voxels. It will be appreciated that with two part compounds, one of the compounds, such as a catalyst, may be required in much smaller qualities than the other compound.

It will appreciated that there may be cases where more than two precursors are printed to form one 'finished' material.

Printing of two or more different materials to the same location results in more homogeneous voxels of the end material, but requires greater accuracy than printing to adjacent locations.

Reduced Capability

Whilst a production line having identical layer groups provides maximum flexibility, for many products this is not needed. For example, many products have a plastic shell. Thus, for example, the first few hundred layers may only require a single material forming the base of the shell. Thus the production line may dispense with printheads that are effectively redundant, so reducing complexity, size and overall cost of the production line. Accordingly some of layer groups may have a reduced number of printheads.

Figure 5:
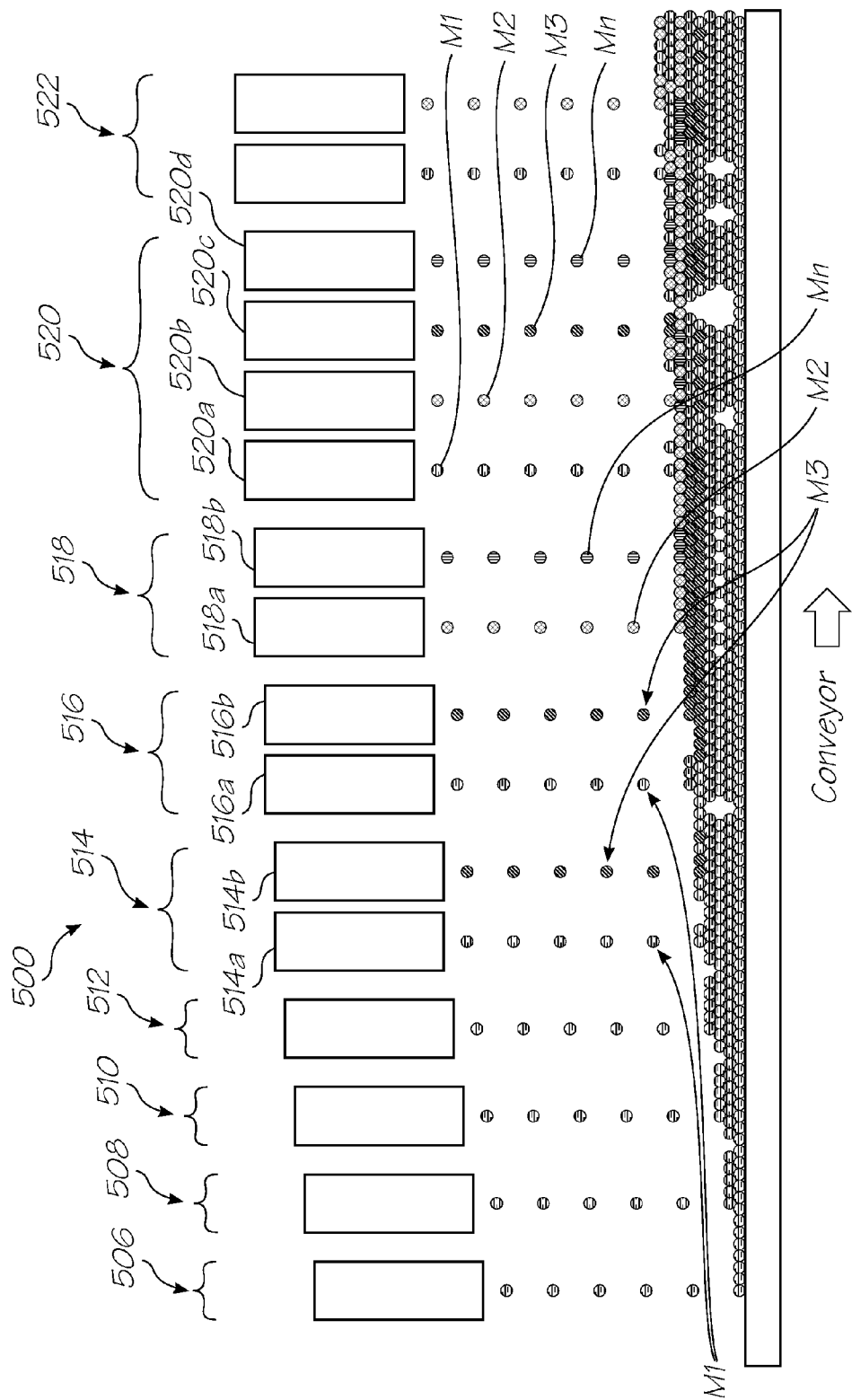
FIG. 5 shows a schematic side view of a production line according to a fourth embodiment of the invention.

FIG. 5 shows the first nine layer groups 506 to 522 in a system 500 having n layer groups.

The first four layer groups, 506 to 512, only have one printhead whilst the fifth, sixth and seventh layer groups 514, 516 & 518 have two printheads each. The printheads of each pair print a different material to that printed by the other printhead of the pair. The eighth layer group 520 has four printheads, printing four different materials whilst the ninth layer group 522 has two printheads, again printing two different materials. It will be appreciated that the number of printheads in other layer groups does not necessarily dictate the number of printheads in a layer group.

The materials printed by each multi-material capable layer group may be the same or different from each other. Thus, for example, the fifth and sixth layer groups, 514 & 516, have printheads 514*a* and 516*a* that print material $M_1$ and printheads 514*b* and 516*b* that print a third material $M_3$.

The seventh layer group 518 has a printhead 518*a* that prints a second material $M_2$ and a printhead 518*b* that prints an $n^{th}$ material $M_n$. Printheads 520*a, b, c* & *d* of layer group 520 print materials $M_1$, $M_2$, $M_3$ and $M_n$, respectively.

Whilst FIG. 5 shows layer groups at the start of the production line having a reduced number of printheads compared to the maximum number of materials printed, it will be appreciated that any layer group in the production line may be limited to printing less materials compared to the maximum number of materials that are able to be printed by the system.

Insertion of Objects

At this stage, because the present minimum resolution is about 10 micron, it is not possible for the system to print all required components of a product. Some components may require finer resolution, such as high-speed semiconductors.

Figure 6:
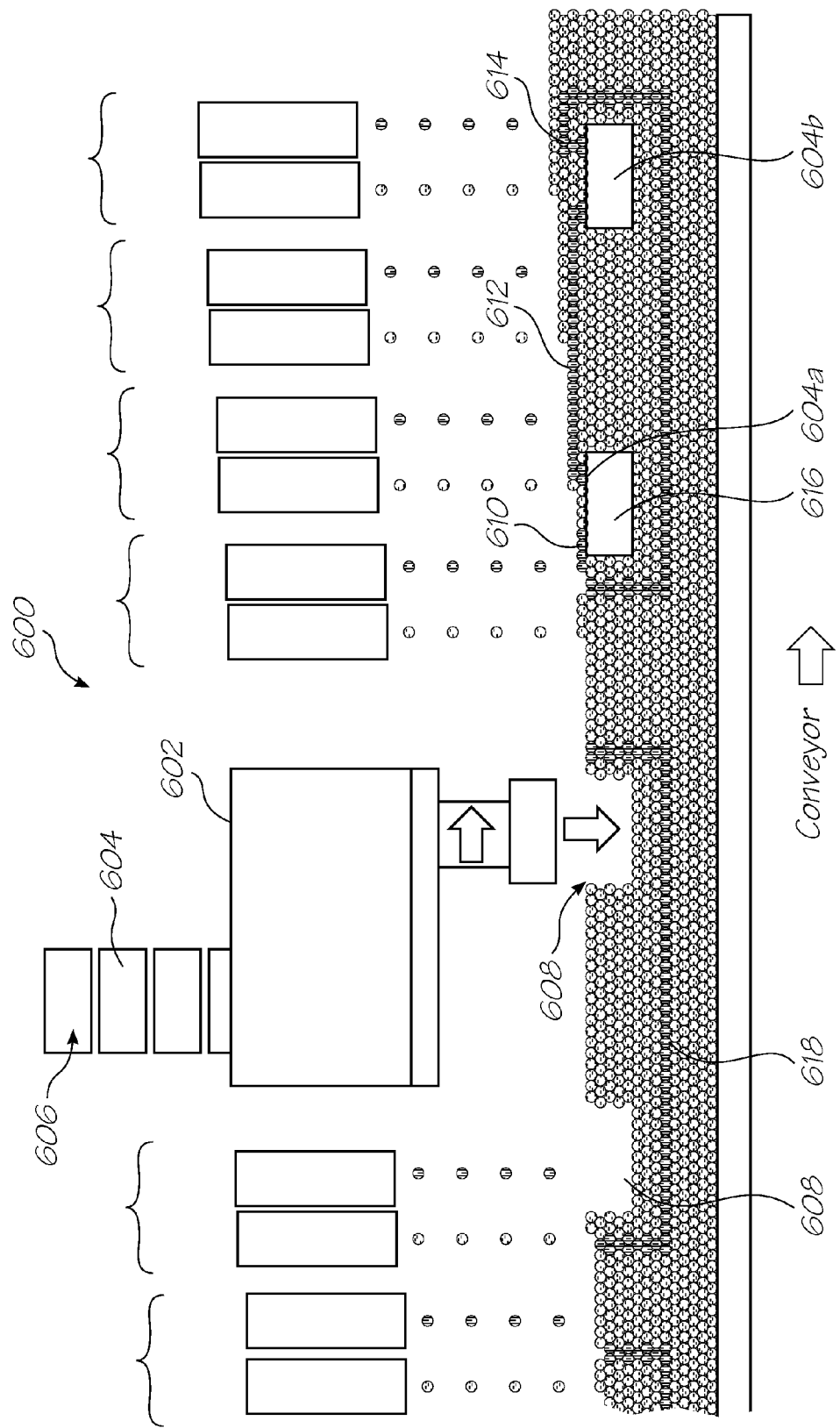
FIG. 6 shows a schematic side view of a production line including an object insertion device.

FIG. 6 schematically shows a production line 600 including a robot 602 for insertion of objects into the products being printed. For clarity the vertical and horizontal scales are exaggerated.

The robot 602 has a supply 606 of objects 604 to be inserted. The robot 602 takes one object at a time and accelerates the object 604 horizontally to travel at the same speed as the conveyor. The object 604 is then moved vertically to be inserted into a cavity 608 previously printed in the product. The cavity 608 is a close fit for the object 604 being inserted and alignment of the object with the cavity is preferably achieved using vision systems. The cavity is preferably sized so that the top of the object does not protrude above the top layer of the object.

Whilst the drawing shows a cavity five voxels high by nine voxels long, this is not to scale. Typically, objects to be inserted have dimensions of the order of millimeters, not microns. A typical object may have a size of 5×5×1 mm (L×W×H) i.e. 5000×5000×1000 microns. Whilst a height of 1 mm may seem small, the clearance between the top layer of the product and the printheads is typically also only about 1 mm. Thus, an object placed on the top layer rather than in a cavity may not clear downstream printheads. Additionally, if the object extends above the top layer, this may cause unpredictable airflows and cause unintended displacement of drops subsequently printed. By inserting, the object into a cavity having a depth at least as great as the object's height, the highest point of the object is flush or below with the top of the product and so does not cause any unexpected results.

Preferably the cavity is sized so that the object is securely and correctly located in the cavity. Placing the object in a cavity also reduces the risk that the object may be moved unintentionally, which may occur if it were placed on the top surface. The outline of the cavity preferably matches the object. Thus, preferably, a rectangular object will be received in a rectangular cavity. However, it will be appreciated that this is not essential. The object may be received in a cavity that holds the object in position but does not have a shape that matches the object's shape. For example, a rectangular object could be located in a triangular cavity, so providing free space about the object. The cavity may be shaped and configured to provide one or more channels or passageways to other locations within the product or to the outside of the product. Thus, for instance, a semiconductor chip may be located in the product and provided with one or more cooling channels, ducts or passageways that extend to the outside of the finished product.

Key types of objects to be inserted typically include integrated circuits such as main processors, memory etc. Whilst it is possible to use package chips it is better to use bare dies for cost, size and weight reasons. Preferably known good dies (KGD's) are used. Semiconductor that may be inserted include but are not limited to transistors; light-emitting diodes; laser diodes; diodes or SCR.

As mentioned previously, one of the materials that may be printed is indium. Another material that may be printed is an insulator, and accordingly it is possible to print insulated electrical 'wires' 610, 612 & 614 in the product. This may be carried out both before or after insertion of the device into the cavity. Whilst the drawing is not to scale, the electrical wires may have a thickness of 10 to 20 microns, i.e. one or two voxels. Wires may be placed in the order of 30 microns from each other and so many millions of wires may be printed in relatively small volumes.

Where electrically active devices are inserted, the devices are preferably inserted with the bond pads 616 facing upwards as this makes the forming of good quality electrical connections much easier. With upward facing bond pads, electrical connections may be formed in the next few layers to be printed. In contrast, bond pads on the bottom or sides of the object will rely on correct placement of the object and good contact.

The device to be inserted may be cleaned by the insertion robot and the printing may occur in a nitrogen atmosphere, or a partial or high vacuum. The bond pads may be plated with indium metal such that when indium is printed onto the bond pads the indium on the bond pad melts forming a good electrical connection.

Once the device has been inserted, downstream layer groups may then print electrical connections. FIG. 6 schematically shows four downstream layers part-printed on the object and showing three electrical connections 610, 612 & 614 printed in upper layers to join two objects 604a & 604b together. It can also be seen in FIG. 6 that earlier layers include metal voxels forming electrical wire 618.

The invention is not limited to insertion of electrical devices. Mechanical devices may also be inserted.

Typical System Characteristics

The following characteristics relate to the preferred embodiments that utilize MEMS inkjet type printheads as referenced in the aforementioned specifications.

Voxels

The building block of the printed object is a voxel. In the preferred embodiment planar layers are printed that have the same dimensions and voxels all of the same dimensions. Most preferably the voxel centers have a hexagonal close pack arrangement.

Figure 7:
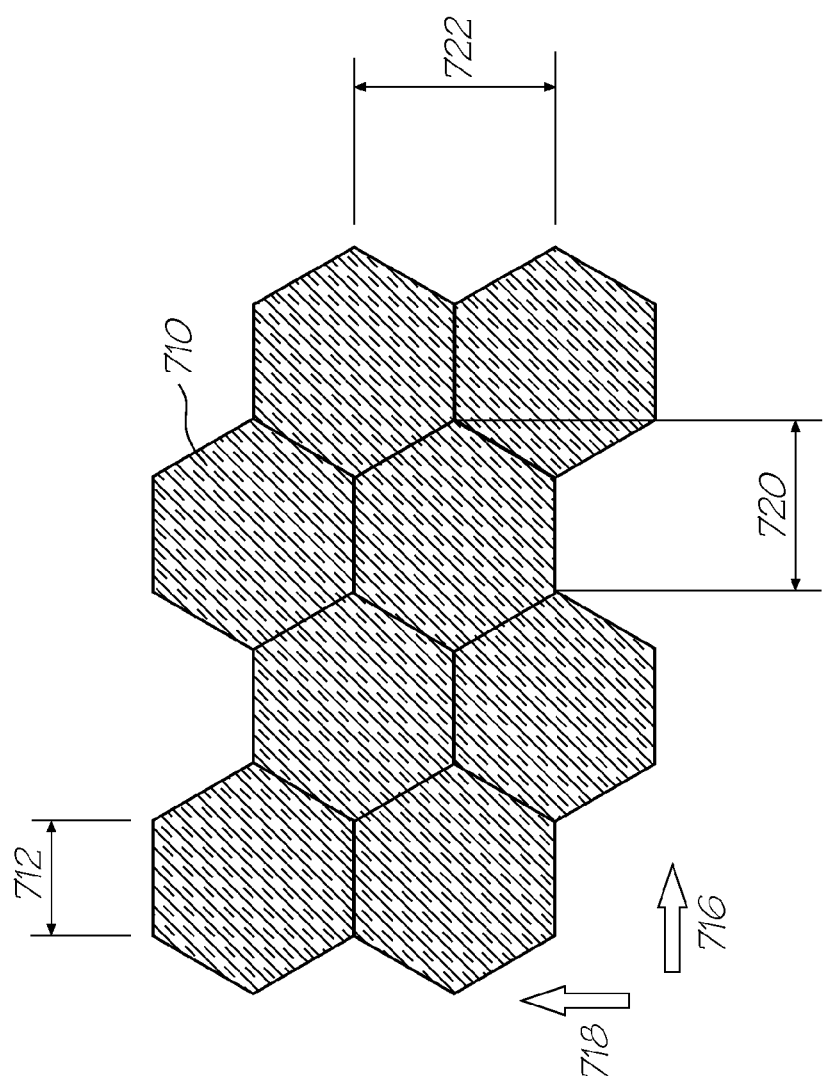
FIG. 7 is a plan view showing a number of voxels of the preferred embodiments.

In the preferred embodiments the voxels 710 have a side length 712 of 6 microns, as shown in FIG. 7. The height of the voxels is nominally 10 micron. This provides a resolution that is typically 10 times higher than existing systems in each direction, giving a voxel density typically 1,000 times greater than existing systems.

A corresponding nozzle of a printhead prints each voxel and so the nozzles of the printheads have corresponding spacing. One or more in rows of voxels 710 are printed by each printhead, with each row extending across the substrate, ads indicated by arrow 716. Rows are printed side by side along the substrate, as indicated by arrow 718. The nozzle pitch 720 is 9 micron, whilst the row spacing 722 is 10.392 microns Each drop of liquid material printed may be treated as a sphere, which in the typical system has a diameter of about 12 microns. When in position and after becoming solid, each drop forms a voxel, with a shape approximating a hexagonal prism with a height of $\alpha$, the layer height, which in a typical system is about 10 microns.

The voxels may be printed in a face centered cubic configuration or in a hexagonal close packed configuration. These configurations have a number of advantages, including increased resistance to crack propagation, smaller voids between drops, and lower resistance of printed conductive lines. Other voxel configurations are possible, with corresponding voxel shapes.

FIG. 8 shows a substrate 810 with a number of layers having been printed is shown. The voxels of even layers 811, 813, 815 and 818 are offset longitudinally by half the voxel spacing relative to the voxels of odd layers 810, 812, 814 and 816. This results in the voxels having a hexagonal arrangement in side view. The number of printheads per layer does not affect the voxel configuration and for clarity only one printhead per layer group is shown.

To achieve the longitudinal offsetting of the voxels 820, the spacing of the printheads 822 in the longitudinal direction is preferably the same between all layer groups and is more preferably an integral number of voxels plus half a voxel. This separation is not critical and it is possible to achieve this half voxel longitudinal offsetting of the printed layers by adjusting when each printhead ejects ink or by a combination of physical offsetting and timing adjustment.

Figure 9A:
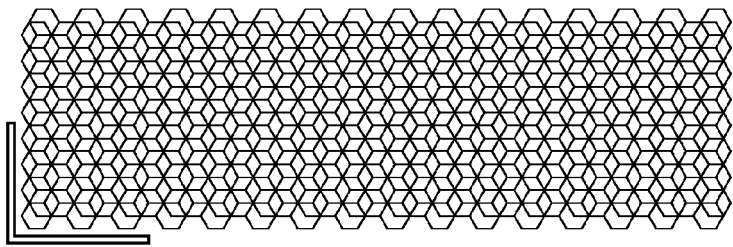
FIGS. 9a, b and c show plan views of an odd layer of voxels, an even layer of voxels and an odd and even layer of voxels.

The preferred printhead utilizes two rows of nozzles to print a single "row" of voxels. The nozzles for odd drops or voxels are located in one row and the nozzles for even drops or voxels are located in another, parallel, row. The two nozzle rows are spaced half a voxel apart transverse to the row direction and are staggered half a voxel parallel to the row direction so that when printed a "row" of odd and even voxels is not a straight line but a zigzag line. FIG. 9a shows a single "row" 901 shaded for clarity. If we assume the printed droplets assume a hexagonal shape in plan view, continuous printing of rows can result in total tiling of the surface with drops. It will be appreciated that other printhead configurations are possible. The main requirement is that, when printed, the droplets can form a substantially continuous layer.

FIGS. 9a, b and c show how, in preferred embodiments, odd and even layers of materials are deposited relative to each other. For ease of reference, a reference mark 900 is shown to indicate relative positions.

Figure 9B:
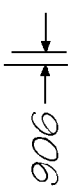
Figure 9C:
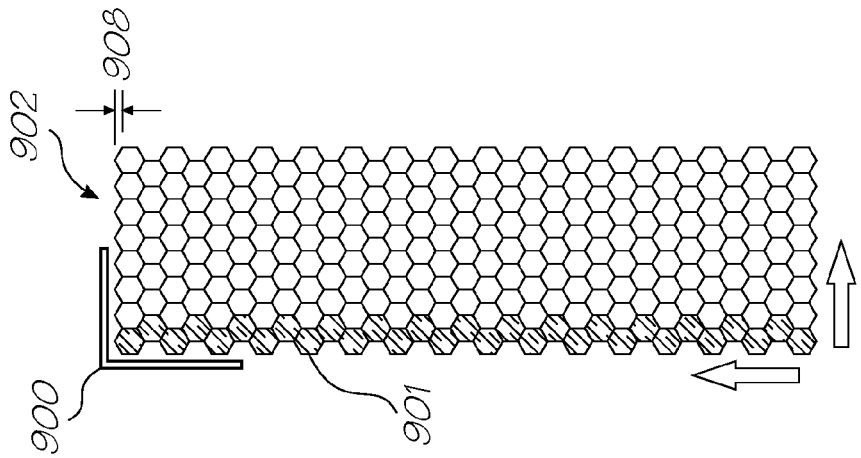

Referring to FIG. 9a, the odd layers 902 are all printed with no "offset". All even layers 904 are printed with a constant offset, relative to the odd layers 902. The even layers are offset by half a voxel in the transverse direction, as shown by numeral 906 in FIG. 9b. The even layers are also offset half a voxel in the longitudinal direction, as shown by numeral 908 in FIG. 9b. The resulting relative positioning of an odd and even layer is shown in FIG. 9c. This results in each voxel being offset half a voxel in both the x and y directions. Whilst it is preferred that offsetting occurs in both the longitudinal and transverse direction, it will be appreciated that the voxels may be offset in only one of the longitudinal or transverse directions.

Transverse offsetting can be achieved by offsetting the printheads. Thus printheads for odd layers can be offset half a voxel transversely relative to printheads for even layers.

Whilst it is preferred that the physical offsetting of the printheads in the longitudinal and vertical direction is constant, variations in both directions can be adjusted for by adjusting when the individual printheads eject ink relative to the others.

Printhead and Layer Group Construction

A typical system is preferably capable of producing objects having up to eight different materials and, accordingly, will preferably have eight printheads per layer group.

Each printhead of a typical system has a printable width of 295 mm, although this may be more or less, as desired. Each printhead includes sixteen printhead chips arranged end on end, with an effective length of 18.4 mm. To increase printing speed each printhead preferably prints two rows of material simultaneously, thus requiring two rows of nozzles. In addition, two additional rows of nozzles are provided for redundancy. Accordingly, each printhead and printhead chip is provided with four rows of nozzles.

Each printhead chip prints 2048 voxels per row and so each printhead chip has 8192 nozzles and each printhead has 131072 nozzles.

Where each layer group has eight separate printheads this requires 128 printhead chips per group and so there are a total of 1,048,576 nozzles per group.

With a layer height of 10 microns, a typical system requires 1000 layer groups to produce an object 1 cm high and so requires 8000 printheads, 128000 printhead chips and provides 1,049 million nozzles.

Print Speed

The nozzle refill time of a typical printhead nozzle is about 100 microseconds. With two rows of material printed simultaneously by each printhead, this provides a printed row rate of 20 kHz. At a row spacing of 10.392 micron in the longitudinal direction this allows a substrate velocity of 208 mm per second. Thus, for example, the system can produce an object 30 cm long about every 1.5 seconds.

With a print width of 295 mm this provides a maximum print area of 61296 $mm^2$/sec and a maximum print volume (at 10 micron voxel height) of 612963 $mm^3$/sec per layer, assuming no voids. For a 1000 layer system this is a total of 0.613 liter/sec. It will be appreciated that in a multiple material object, most layers will be made of different materials. Thus, whilst the maximum volume rate will be this value, each printhead will not be printing at the maximum rate.

Memory

In the preferred embodiments we have a system that may require up to about 98 Gbytes of data. Since we have all the layers of a defined product(s) being produced simultaneously, all of that data is being accessed effectively simultaneously. In addition, the data is being read repetitively. Assuming a product size of about 450 mm longitudinally, each and every layer is printed about every 2½ seconds and so the relevant data needs to be accessed every 2½ seconds. For shorter layers, the data is read more frequently.

The quantity of data and the need to access the data simultaneously and continuously means that, with present technologies, it is not practical to store the data in a central location and/or to use disk drives to store the data that is accessed by the printheads. If disk drives were used they would be used continuously and be a major risk of failure. To provide disk redundancy would also result in unnecessary complexity. As solid state memory has no moving parts, its failure rate is much lower. Accordingly, in the preferred embodiments the data is stored in solid state memory and this solid state memory is distributed across the layer groups of the system. Each layer group stores data relating to the layer currently being printed by that layer group in memory located on or in the layer group. Once the necessary data has been downloaded to the layer groups, they do not need to access an external source of data, such as a central data store. By incorporating the memory in the layer group, and more preferably in printheads or printhead chips, high speed access to the data for each and every layer group is readily provided "internally". In the typical system each layer group normally prints one layer repeatedly and so, at a minimum, only needs to access the data for one layer at any one time. In preferred embodiments each layer group also stores data relating to other layers, for fault tolerance, as will be discussed later.

The memory used is preferably Dynamic Random access Memory (DRAM). Currently available DRAM provides sufficiently fast read access to meet the requirements of the system. In the preferred embodiments this memory is located on each printhead.

In the preferred systems each printhead is constructed of sixteen printhead chips and those printhead chips each have 4096 active nozzles. Each printhead chip is provided with 256 Mbits of DRAM to define the relevant portion of the layer to be printed, or 64 Kbits per nozzle. If we allow 2 Kbits to define the layer and the specific material we have approximately 62 Kbits for voxel locations per nozzle. Thus we can specify up to about 63,000 (62×1024) locations longitudinally. With a longitudinal size of each voxel of 10.392 micron this equates to a maximum product length of about 660 mm. This does not allow for redundancy or other overheads that may reduce the available memory and so the maximum number of locations.

Thus, a printhead having 16 printhead chips has 4096 Mbits of DRAM and with 8 single material printheads per layer group, each layer group has 32,768 Mbits of DRAM. A production line having 1000 layers groups thus has 32,768,000 Mbits or 4096 Gbytes of DRAM. Whilst this is a significant amount, the cost is relatively low compared to the productivity possible with the system.

It will be appreciated that the total amount of memory provided is dependant on the total number of different materials used and the maximum size of objects to be produced. Whilst the transverse length of the printheads limits the size of objects in the transverse dimension, there is no limit on the size of objects in the longitudinal direction. The maximum size is limited by the memory provided which is also the maximum amount of memory required. When defining a voxel in the product, the material in the voxel and the layer in which it occurs needs to be specified. However, it is possible to dispense with this data at the printhead level. In the typical system each printhead only prints one material in only one layer. If the printhead only stores data relating to voxels that it prints, the data specifying the layer and material is redundant. Thus, potentially, the amount of data stored per printhead may be reduced. However, as set out above, this saving is relatively negligible.

Data Rate

Each printhead chip operates at 100 KHz, prints two rows of voxels each of 2048 nozzles and so requires a data rate of 39 Mbits/second so (4096 nozzles at 100 KHz). This is well within the capabilities of currently available DRAM. This results in data rates of 625 Mbits/second for each printhead, 5000 Mbits/sec for each layer and 5,000,000 Mbits/sec (or 625 Gbytes/sec) for the entire production line. It is thus quite impractical at present to have a central data store and to pipe the data to the individual printheads. It will be appreciated that if future developments allow sufficiently high data transfer rates to be practicable, one or more centralized data store(s) may be used as the source of print data, rather than relying on distributed memory residing on the printheads or printhead chips themselves.

A central data store defining the products(s) is required but the data from that store only needs to be downloaded to the individual layer groups, printheads or printhead chips when the product(s) being produced change, either totally or when modified. Whilst the system may require of the order of 4096 Gbytes of memory in the layer groups, this transfer does not need to be "instantaneous" as changes will be downloaded when the system is not operating.

Fault Tolerance

In a system with approximately 1000 layer groups, 8 printheads per layer group, 16 printhead chips per printhead and 2048 nozzles per printhead chip, there will be about 1 billion nozzles. As such, it is expected that spontaneous failures will be a regular occurrence. It is not practicable to stop the manufacturing process to replace failed printheads, as this will require scrapping of all partially completed products on the conveyor. Thus, a 1000 layer manufacturing line may lose thousands of products every time the system unexpectedly stops. The number of products on the production line depends on product size, product spacing on the conveying system and the spacing of layer groups. Planned stoppages do not result in scrapping of product as each layer group, commencing with the first, may be sequentially turned off to stop producing products.

There are two primary levels of fault tolerance that aim to prevent unexpected stoppages. One is within the printhead itself and one is between layer groups.

Printhead Fault Tolerance

Each printhead provides a level of fault tolerance. In the preferred embodiments in which stationary printheads are used, the printhead chips are provided with redundant nozzle arrays. If a nozzle fails, a corresponding nozzle in one of the redundant nozzle array(s) may take up its function. However, since the printheads are fixed, each nozzle prints at the same transverse location and can only be replaced by one or more specific redundant nozzle(s). In a printhead with one set of redundant nozzles, each row location can only have one failure before the printhead becomes unable to correctly print material at all locations. If a nozzle fails, the corresponding redundant nozzle replaces it. If that 'redundant' nozzle then fails, it cannot be replaced and so the entire printhead would be considered to have failed. Whilst the preferred embodiments only have one redundant nozzle for each location, more than one set of redundant nozzles may be provided.

It will be appreciated that in a multi-material system each printhead does not necessarily print a full row. This depends on the product or products being printed. Thus many printheads will only utilize some of the printhead nozzles when producing products. The status of unused nozzles is not relevant to the ability to correctly print the current product and so the printheads may be configured to determine from the product data relating to the layer being printed which nozzles need to be tested both before printing and whilst printing is occurring.

For fault tolerance reasons, as discussed later, a printhead may need to keep an inventory of failed but unused nozzles, as these nozzles may be needed if the layer group needs to print another layer. Thus at initialization, each printhead may test all nozzles independent of product data. After determining if any nozzles have failed, those nozzles may be mapped against the product data to determine if the printhead should be mapped as failed or not. If a printhead is considered to have failed, then generally the entire layer group must be considered to have failed.

Layer Group Fault Response

The preferred system relies on each layer group carrying out testing of itself and of the immediately upstream or downstream layer group. Testing results are passed to a central controller. A layer group will be declared to have failed and will be automatically "mapped out" by the central controller if:

1). the layer group's self-test circuitry or external (to the layer group) testing detects a fault that cannot be accommodated by onboard redundancy;
2). the immediately or downstream upstream layer group detects that the layer group is not responding or not responding correctly to interrogation, or
3). power fails to the layer group.

The above list is not exhaustive and other circumstances may require a layer group to be "mapped out".

Failure of a layer group must not prevent communication between its adjacent layer groups and so communication between any two layer groups is not dependant on intermediate layer groups. The failure of a layer group should also not cause failure in the product being printed by that layer group when it fails.

Referring to FIGS. 10 to 18 there are schematically shown a number of layer groups of a system 1000 designed for producing products with up to n layers. Accordingly, the system 1000 has n active layer groups. The system has a series of spare layer groups 1012, 1013 & 1014 that in 'normal' use are not used. These 'spare' layer groups are located downstream of the $n^{th}$ active layer group 1011. In the drawings, three 'spare' layer groups are shown. It will be appreciated that the number of spare layer groups may range from one upwards. In this system all layer groups, including spare layer groups are functionally identical.

For the purposes of explanation it is assumed that there is no transverse offsetting of odd and even layer groups and that an odd layer can be printed by an 'even' layer group and vice versa.

Each layer group, as discussed elsewhere, has onboard memory that stores all the data necessary to define at least one layer. In the embodiment of FIGS. 10 to 18, each layer group has sufficient memory to store data for three layers. For ease of explanation the drawings show each layer group having three separate memory stores, represented by a separate square in the drawings, labeled a, b & c, each representing the memory needed to store the data for one layer. Of course in practice, the memory may be continuous.

Each layer group stores data for the layer that it is presently printing and for the two previous layers. Thus, layer group m stores data for layer m, layer m−1 and layer m−2 in memory stores a, b and c, respectively. The data for each layer is represented in the drawings by the code $L_n$ in the memory squares, where n is the layer number. The first layer group 1001 only stores data $L_1$ for the first layer, as it has no upstream layer groups whilst the second layer group 1002 only stores data $L_1$ & $L_2$ for the first and second layers. The indexes 1015 above the boxes represent the layer being printed by each layer group.

Figure 10:
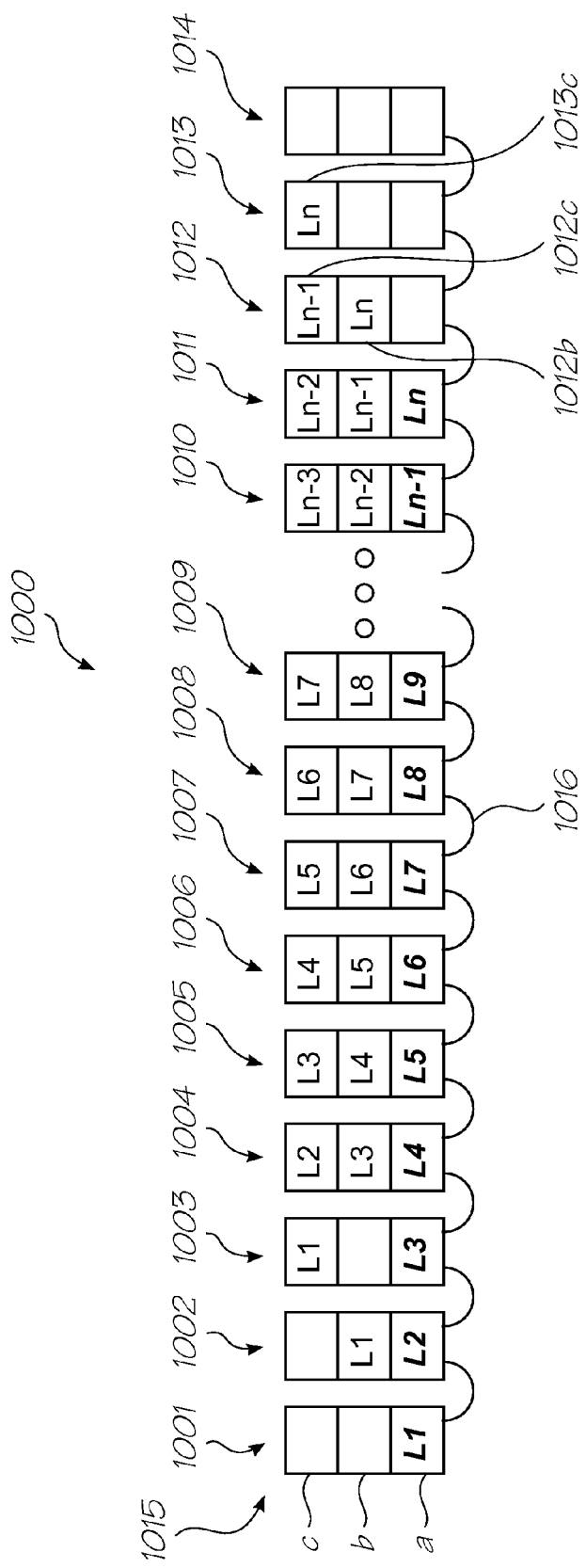
FIG. 10 is a diagram showing how each layer group stores data relating to multiple layers of material in an initial printing configuration.

The spare layer groups are physically identical to the other layer groups, but, as shown in the FIG. 10, only the first two spares 1012 and 1013 are initially loaded with data. The first spare 1012 is initially loaded with data $L_n$ and $L_{n-1}$ relating to layers n and n−1 in memory stores 1012b and 1012c. The second spare 1013 only has data $L_n$ for layer n, stored in memory store 1013c whilst the third spare 1014 and beyond, if any, initially have no data in memory.

The layer groups have data transfer links 1016 configured to enable layer data in the memory of one layer group to be transferred to the two immediately adjacent active layer groups, i.e. an upstream and a downstream layer group. There may be one or more "inactive" layer groups between active layer groups. Inactive layer groups are ignored by the system and the system is configured so that an inactive layer group cannot affect operation of the system. Typically an inactive group is one that has suffered a failure that prevents it printing material as required. However, fully functional layer groups may be mapped out as 'inactive' for other reasons.

Referring to FIG. 10 the initial configuration is shown and each layer group prints the corresponding layer, i.e. the first layer group 1001 prints layer one, the second layer group 1002 prints layer two, etc.

Figure 11:
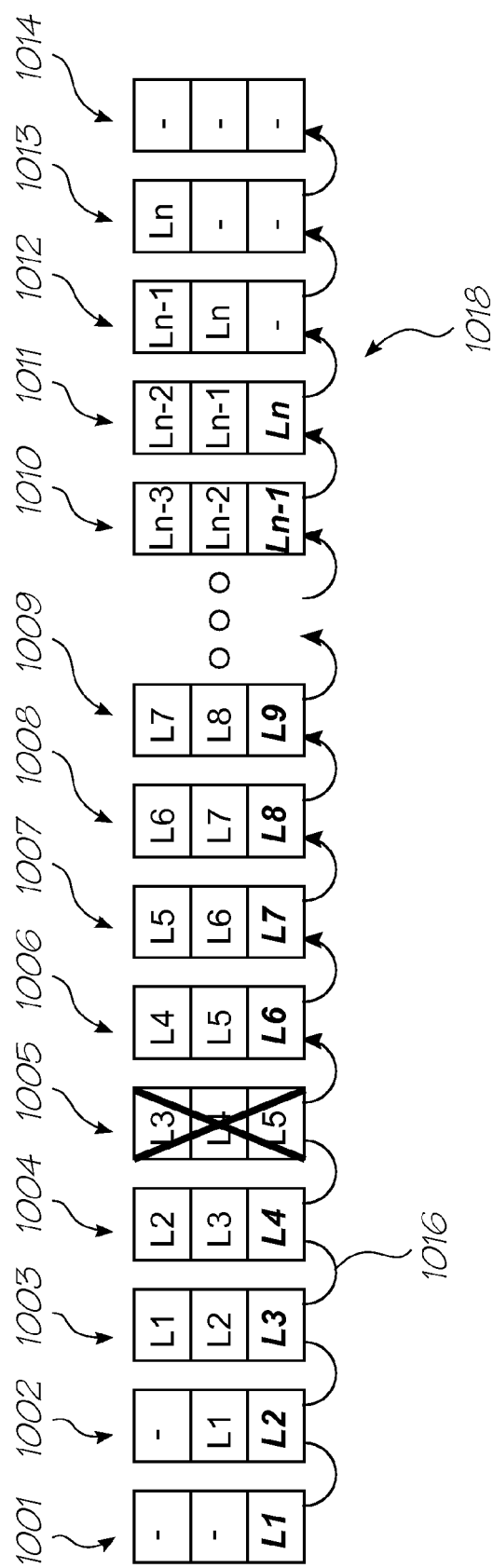
FIG. 11 is a diagram showing the situation when a first failure of a layer group has just occurred.

FIG. 11 shows the situation where the fifth layer group 1005 has been determined to have failed. The system maps out fifth layer group 1005 and all layer groups downstream of layer group 1005 are instructed to print an earlier layer. Thus, layer group 1006 is instructed to print layer five, layer group 1007 is instructed to print layer six and the $n^{th}$ layer group is instructed to print layer n−1. This is achieved by sending an 'advance' signal 1018 to all the downstream layer groups, preferably via the data link 1016 when a layer group fails. The advance signal is also propagated to the 'spare' layer groups and so spare layer group 1012 is instructed to print layer n.

This is possible as there is sufficient time between failure being detected and the substrate moving from one layer group to the next layer group and because each layer group already holds data defining an earlier layer. The time available to switch over is of the order of a few hundred milliseconds. Thus, the next layer group may finish off the part completed layer printed by the upstream layer group. The layer group 1004 now communicates directly with layer group 1006 and bypasses layer group 1005, which is no longer active.

This switch over may be effectively instantaneous as all the layer groups already hold data defining the previous layer. Thus, even if layer group five fails part way through printing its layer, layer group six may complete that layer as layer group six already holds data relating to layer five. If there is sufficient gap between adjacent products, layer groups six onwards may complete printing of their respective layers before switching to an earlier layer. In these circumstances, layer group six would complete layer six on one product, complete the part completed layer five of the next product and then print layer five on subsequent products. Layer groups seven onwards would complete their original layers and then switch to printing the earlier layers.

Figure 12:
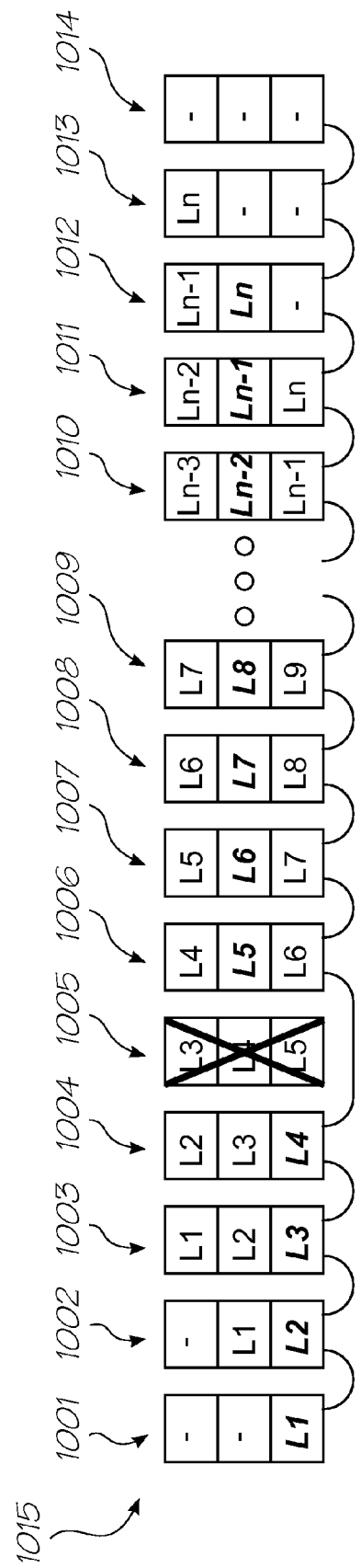
FIG. 12 is a diagram showing the logical arrangement of layer groups after a first failure of a layer group when the layer groups have been remapped.

Referring to FIG. 12, layer group 1005 is now mapped out and all downstream layer groups are 'moved' upstream one layer, i.e. layer group 1006 becomes the fifth layer group, layer group 1007 becomes the sixth layer group, layer group n becomes the $(n-1)^{th}$ layer group and the first spare layer group 1012 is mapped as the $n^{th}$ layer group.

At this time, each layer group downstream of the failed layer group holds data relating to the layer it is now printing, the immediate upstream layer and the immediate downstream layer. Thus, layer group 1006, now mapped as the fifth layer group, has data for layers four, five and six. The data for the immediate downstream layers is not required by any of the layer groups and so may be replaced.

Figure 13:
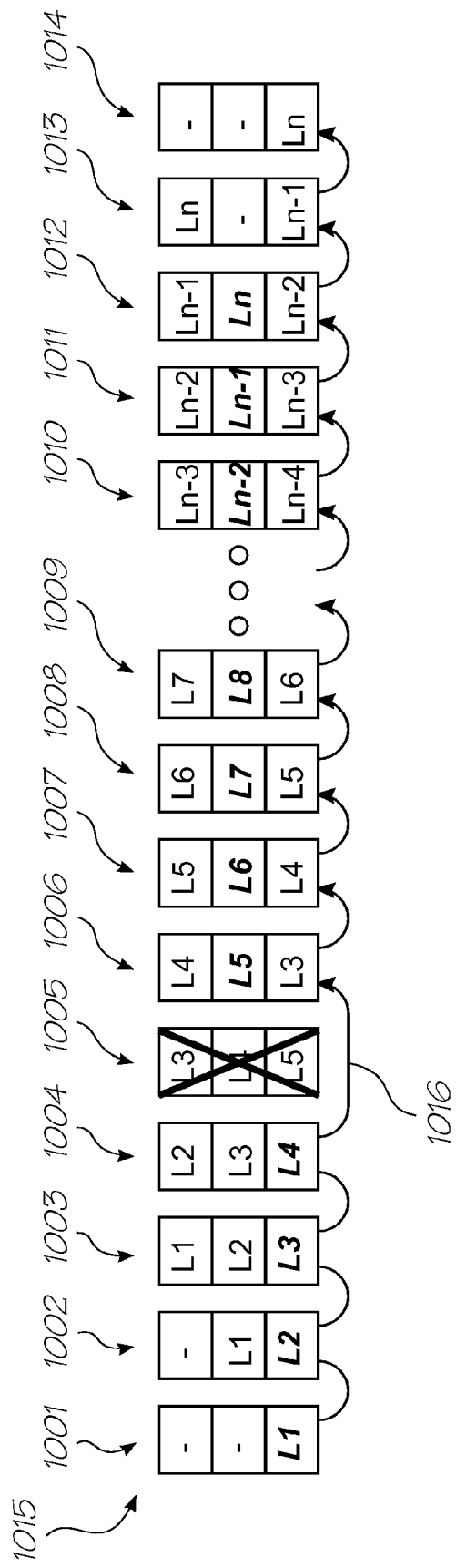
FIG. 13 shows the transfer of data after remapping of layer groups.

Transfer of data between the layer groups now occurs via data link 1016, as shown in FIG. 13. The data $L_6$ in layer group 1006 relating to layer six is replaced with data $L_3$ relating to layer three. This data $L_3$ is obtained from the immediate upstream layer group 1004 via data link 1016.

Simultaneously, layer group 1006 transfers data $L_4$ relating to layer four to layer group 1007 to replace the now redundant data $L_8$ defining layer eight. A similar transfer occurs simultaneously for all the layer groups downstream of the failed layer group, i.e. in an active layer group previously mapped as layer group m+1 and now mapped as layer group m, data relating to layer m+1 is replaced with data relating to layer m−2 from layer group m−1. The first spare 1012, now mapped as the $n^{th}$ layer group, transfers data relating to layer n−1 to the second spare 1013 and the third spare 1014, which originally held no data, receives data relating to layer n from layer group 1013. Simultaneous transfer is possible because all the layer groups hold the necessary data in memory. Whilst data for all n layers is transferred substantially simultaneously, the data link 1016 only carries data for one layer between adjacent layer groups. In addition, the switchover to accommodate a failed layer group is not dependant on the completion of this data transfer. Thus, the capacity of the data link need not be high.

Figure 14:
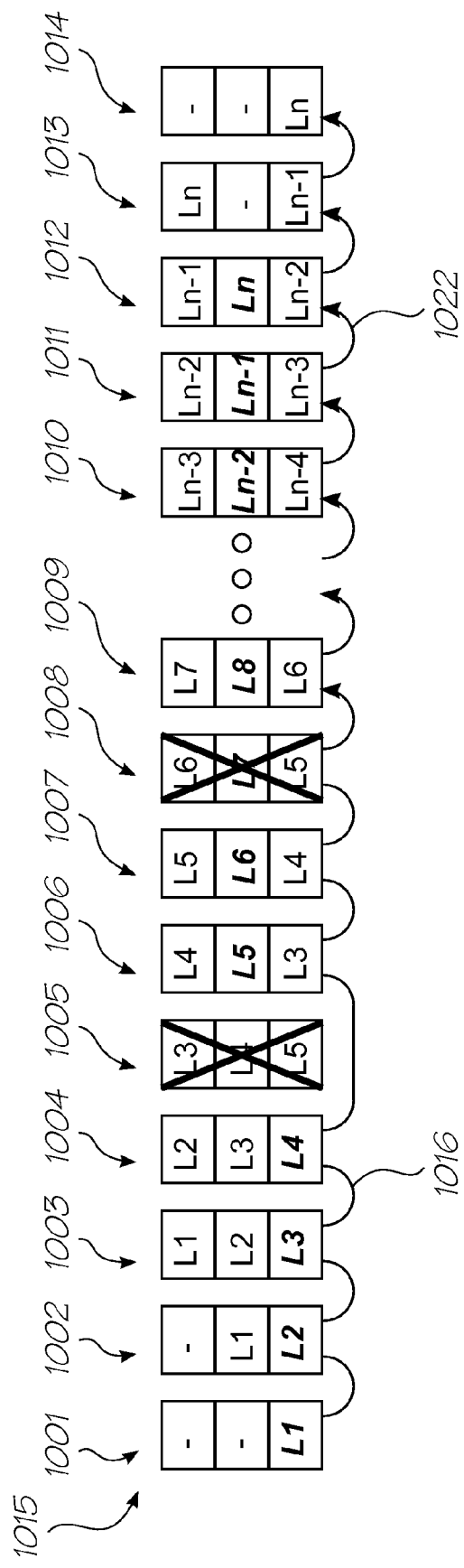
FIG. 14 is a diagram showing the situation when a second layer group fails.
Figure 15:
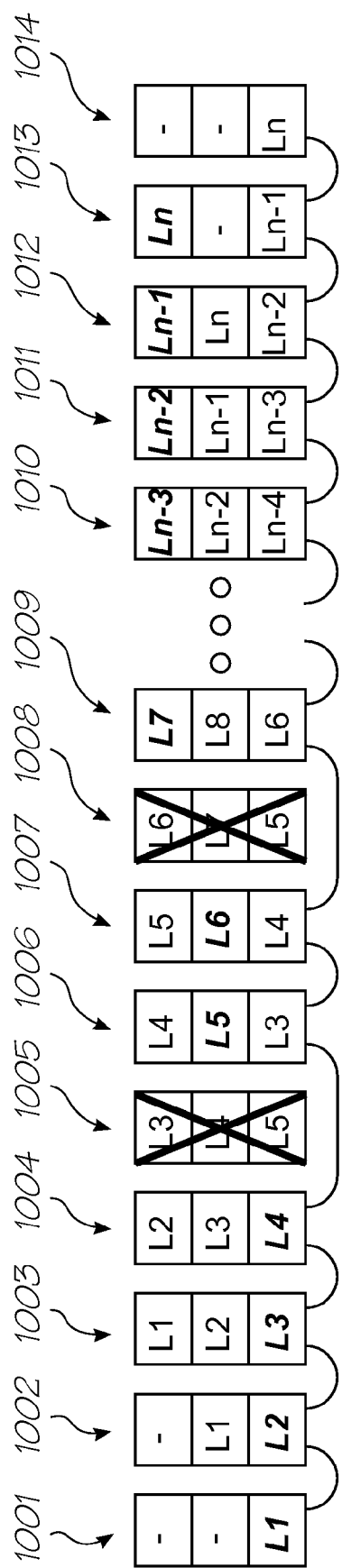
FIG. 15 is a diagram showing remapping of layer groups after the second failure but before all data has been transferred.

Referring to FIGS. 14 & 15, assume layer group 1008, now mapped as the seventh layer group fails. A second 'advance' signal 1022 is sent to all active layer groups downstream of layer group 1008 to cause them to print the previous layer, as previously described i.e. layer group 1009 synchronously takes over printing layer seven, the first spare 1012 prints layer n−1 and the second spare 1013 prints layer n, with the third spare 1014 still unused.

In the typical system approximately 10.6 Gbytes of data is required to define all the voxels of each layer and the transfer of this amount of data takes some time. However, because each layer group holds data relating to two upstream layers, a failure of a layer group that occurs whilst the data transfers occurring will not be fatal.

Figure 16:
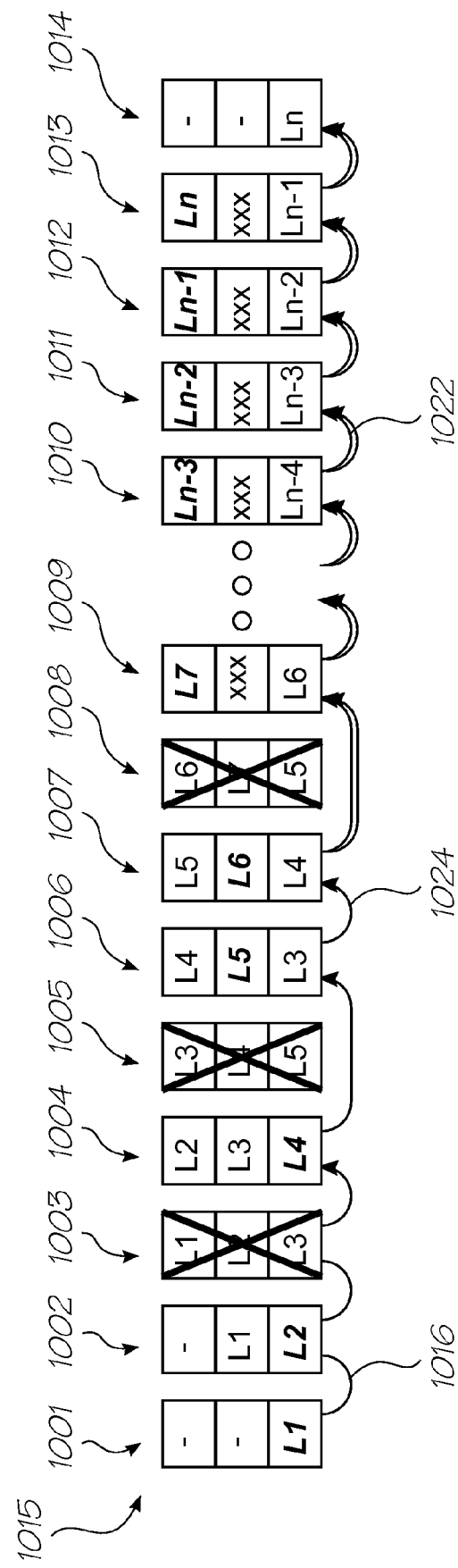
FIG. 16 is a diagram showing the situation when a third failure occurs before the data transfer relating to the second failure has completed.
Figure 17:
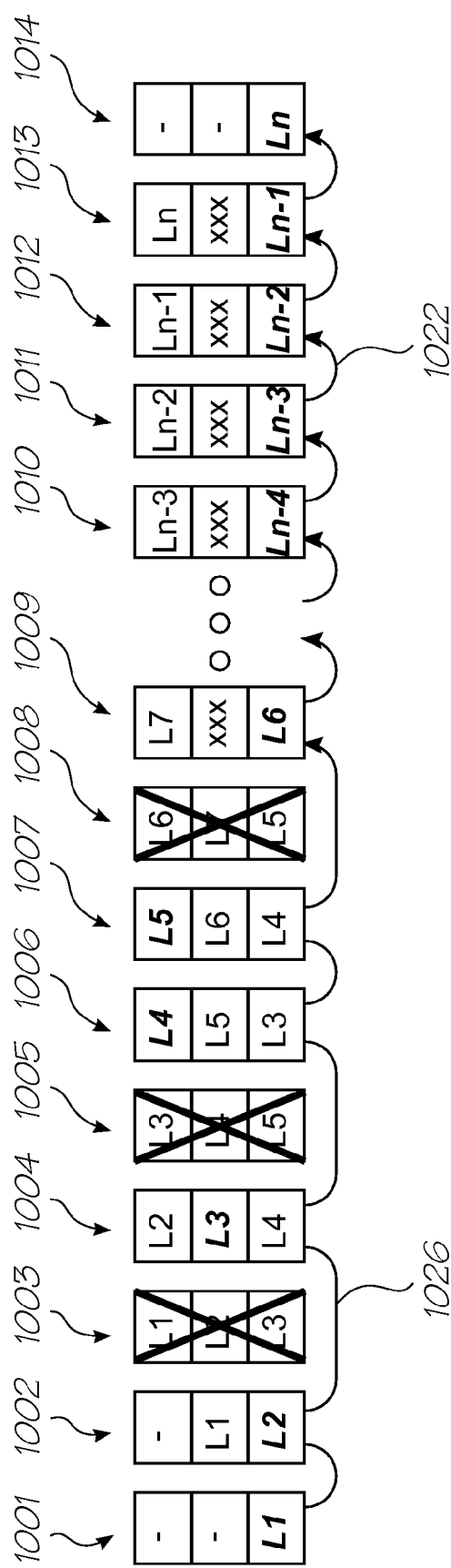
FIG. 17 is a diagram showing the next actions to accommodate the second and third failures.

Referring to FIG. 16, assume that the transfer of layer data as a result of the failure of layer group 1008 is still occurring when layer group 1003 fails. Thus data transfer 1022 is still occurring. A third 'advance' signal 1024 is generated and sent to all active layer groups downstream of layer group 1003. Layer groups 1004, 1006 and 1007, now mapped as layer groups four, five and six are not in the process of replacing data in their memory and can synchronously commence printing layers three, four and five respectively. Although mapped layer groups seven to n are in the process of replacing data in one memory store, they also already hold in memory data for the immediate upstream layer. Thus, layer group 1009 already holds data relating to layer six; the eighth layer group holds data for layer seven, all the way through to the third spare 1014, which holds data for layer n. Thus all the downstream layer groups already hold the necessary data and so all may shift to printing the upstream layer whilst the first data transfer 1022 is still occurring and on receipt of only an advance signal. This is shown in FIG. 17.

Figure 18:
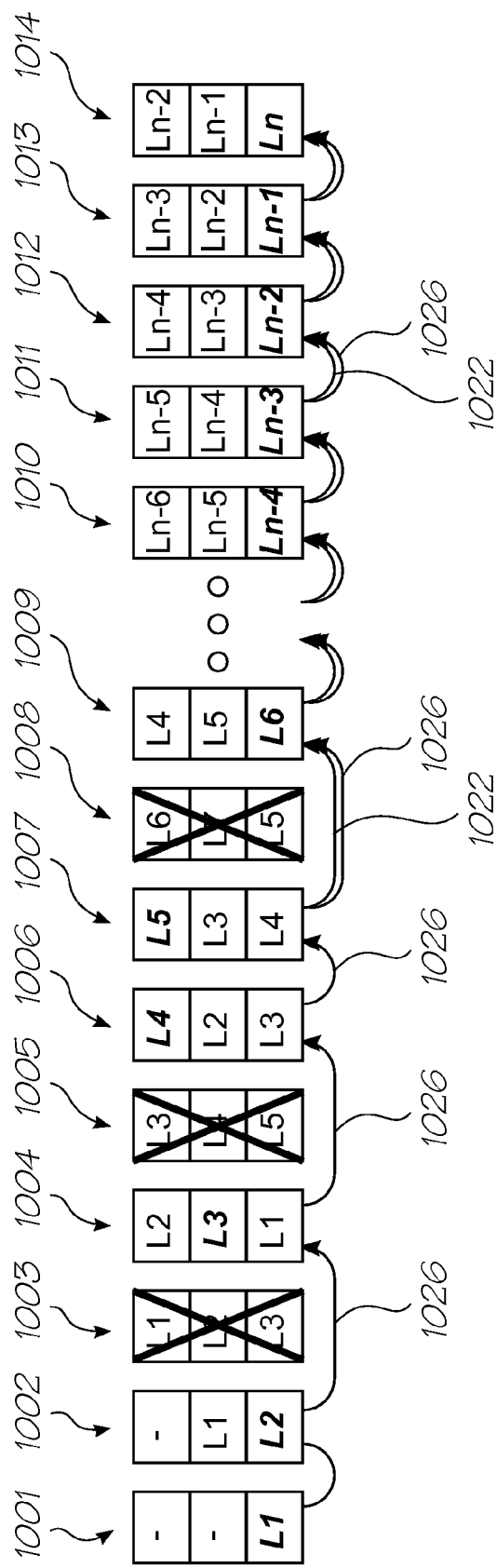
FIG. 18 shows the next stage in the fault recovery process.

An additional instruction is issued to replace the data in each layer group m relating to layer m+1 with that relating to layer m−2. Accordingly, as shown in FIG. 17 layer group 1002 transfers data $L_1$ relating to layer one to layer group 1004. Layer groups 1009 onwards, now mapped as layer groups six onwards, continue with the first data transfer 1022, so that layer group data still populates one of its memory stores with data relating to earlier layers. The second data transfer 1026 is commenced, preferably occurring simultaneously with the first transfer 1022, to transfer data relating to earlier layers. Depending on the capacity of the data link 1016, the second data transfer may be delayed until the first transfer has completed. FIG. 18 shows the layer data in the memory stores of the layer groups after the two data transfers have been completed.

Whilst the first data transfer is still occurring, layer groups 1009 onwards do not hold a complete data set for an upstream layer. As such, if a fourth failure were to occur before the first data transfer is completed the system has no layer redundancy. However, as soon as the first data transfer is complete all of the layer groups will hold data relating to the current layer being printed and the immediate upstream layer, so restoring data redundancy for one failure. When the second data transfer completes the system is restored to having redundancy for two failures.

The system can thus cope with two failures occurring in the time it takes to transfer data relating to one layer between the layer groups. If greater fault tolerance is required, it is merely a matter of providing more memory in each layer group. A system in which each layer group can store data relating to i layers will be able to continue even if i−1 failures occur in the time to transfer one layer's data between layer groups.

If the number of spare layers is greater than i, the number of spare layer groups does not affect the number of "simultaneous" failures that may occur before data transfer has completed. However, the number of spare layer groups does effect the cumulative number of failures that may be accommodated before the manufacturing line needs to be stopped in a controlled manner for replacement of failed printhead or layer groups. It will be appreciated that in practice the number of spare layer groups maybe much greater than three.

In the embodiment shown in FIGS. 10 to 18 all of the layer groups are identical, with a series of identical spare layer groups at the downstream end of the $n^{th}$ layer group. Where a production line does not have all layer groups identical, it will be appreciated that the one production line may be treated as a series of smaller logical production lines placed end on end, in which the layer groups of each logical production line are identical. In this situation, spare layer groups may be located at the downstream end of each logical production line and before the start of the next logical production line. It will also be appreciated that a non-identical layer group may replace a layer group, so long as the replacement is capable of printing all of the materials printed by the failed layer group. As an example, layer groups that only print one or two materials can be replaced by downstream layer groups that can print eight materials, so long as the eight materials include the first two.

In the system described, all layer groups can print both odd and even layers. However, in some cases odd layer groups may not be able to print even layers and even layer groups may not be able to print odd layers. An example of such a case is where voxels are arranged in a hexagonal close pack arrangement and odd layer groups are physically offset transversely relative to even layer groups.

In this case when a layer group fails, the next layer group would not be able to print the previous layer and need to be mapped out. Thus, for example, if layer group five fails, both it and layer group six would be mapped out. Layer group seven would then print layer five and layer group eight would then print layer six, and so on. Thus each failure would require the use of two spare layer groups and so twice as many spare layer groups would be required to provide the ability to cope with the same number of failures. It follows that odd layer groups will store data relating to odd layers and even layer groups will store data relating to even layers. Thus layer group m will sore data relating to layers m, m+2 and m+4. Apart from these differences, the system would function identically to that described.

As mentioned previously, a printhead may be able to successfully print material for one layer despite having one or more failed but unused nozzles. However, one or more failed nozzles may be required for printing of earlier layers. As each layer group has memory for multiple layers, it is possible at initialization, or at other times, to determine if the printhead is capable of printing all the layers held in memory, not just the layer being printed. The layer group may then hold a status flag for the other layers indicating whether it is capable of printing them.

If a failure occurs in another printhead that requires the layer group to print a layer that it cannot, the layer group may be mapped out as well. Effectively this would result in two simultaneous failures that needed to be accommodated. As such it may be desirable to increase the number of layers held in memory by each layer group.

It will be appreciated that this scenario has the potential to reduce the number of 'failures' and hence the number of spare layers required but at the same expense of requiring more memory to provide the same level of simultaneous built in redundancy/fault tolerance.

Whilst the present invention has been described with reference to semiconductor devices printing micron sized voxels, it is to be appreciated that the invention is not limited to the printing devices described or the voxel sizes described. Similarly, whilst preferred forms utilize about 1000 separate subsystems or layer groups, the invention is not limited to systems having this many subsystems or layer groups.

Technologies currently exist that involve the (random) spraying of molten metal droplets onto a former to form a metallic structure (see U.S. Pat. No. 6,420,954 for an example). It is within the scope of the invention to print or otherwise deposit droplets of metals having melting points significantly above that of semiconductor materials and in much larger drop sizes, for the formation of 'bulk' objects.

Many metal objects are cast or otherwise formed to a 'rough' state. The rough casting is frequently then subject to various machining processes to arrive at the finished article. Printing of metal objects allows finished products to be produced without the need for such machining.

Preferred embodiments of the invention produce voxels of material that are substantially the same size, independent of location or material. There is also a one to one relationship between voxels and 'droplets', i.e. each voxel is constructed of one cured 'droplet' of material. Depending on the product, certain portions may not need to be produced to the same fineness, such as the bulk layers of a casing. Accordingly these may be formed of larger droplets of materials. Accordingly different layer groups may have printheads printing the same materials but in different drop sizes to produce either 'super size' voxels or multiple 'standard' size voxels.

The invention clamed is:

1. A printer system for developing a three dimensional (3D) printed structure, the system comprising:
   a plurality of spaced apart sets of printing devices;
   a conveyor system arranged to serially convey a print medium operatively with respect to each set of printing devices at a substantially constant linear speed so that printed voxels from each successive set of printing devices form successive layers of the 3D printed structure upon the print medium; and
   a robot configured to place an object upon layers of the 3D printed structure.

2. A printer system as claimed in claim 1, wherein the robot includes a translation mechanism configured to translate the object at substantially the same speed as the conveyance of the print medium during placement.

3. A printer system as claimed in claim 2, wherein the robot includes a further translation mechanism configured to translate the object towards the print medium during placement.

4. A printer system as claimed in claim 1, wherein the printing devices are arranged so that each successive set of printing devices is located further from the conveyor than any preceding set.

5. A printer system as claimed in claim 4, wherein each set of printing devices includes a plurality of printing devices arranged in a row.

6. A printer system as claimed in claim 1, wherein all of the printing devices in each set of printing devices are configured to print voxels of material concurrently.

7. A printer system as claimed in claim 1, wherein each set of printing devices is a singleton set containing exactly one printing device.

8. A printer system as claimed in claim 1, wherein the material printed by set of printing devices comprises any one of the following group: a polymeric material, a metallic material, a sacrificial material, and an evaporative drying material.

9. A printer system as claimed in claim 8, wherein the metallic material is any one of the group of: Indium and an alloy of Indium and Gallium.

10. A printer system as claimed in claim 1, further including plurality of curing mechanisms interleaved between sets of printing devices and configured to cure the printed voxels.

11. A printer system as claimed in claim 10, wherein each curing mechanism is configured to carry out at least one of the following operations: cooling to cause the voxels to solidify, evaporative drying, precipitation reactions, catalytic reactions and curing using electromagnetic radiation.

12. A printer system as claimed in claim 11, wherein said electromagnetic radiation includes ultra violet radiation.

* * * * *